(12) United States Patent
Tzoufras et al.

(10) Patent No.: US 10,559,338 B2
(45) Date of Patent: Feb. 11, 2020

(54) MULTI-BIT CELL READ-OUT TECHNIQUES

(71) Applicant: SPIN MEMORY, Inc., Fremont, CA (US)

(72) Inventors: Michail Tzoufras, Sunnyvale, CA (US); Marcin Gajek, Berkeley, CA (US); Kadriye Deniz Bozdag, Sunnyvale, CA (US); Mourad El Baraji, Freemont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/028,412

(22) Filed: Jul. 6, 2018

(65) Prior Publication Data
US 2020/0013445 A1   Jan. 9, 2020

(51) Int. Cl.
*G11C 11/16* (2006.01)
*H01L 27/22* (2006.01)
*H01L 43/08* (2006.01)

(52) U.S. Cl.
CPC ........ *G11C 11/1673* (2013.01); *G11C 11/161* (2013.01); *G11C 11/1655* (2013.01); *G11C 11/1657* (2013.01); *G11C 11/1675* (2013.01); *H01L 27/222* (2013.01); *H01L 43/08* (2013.01)

(58) Field of Classification Search
CPC .............. G11C 11/1673; G11C 11/161; G11C 11/1655; G11C 11/1675; H01L 27/222; H01L 43/08
USPC ......................................................... 365/158
See application file for complete search history.

(56) References Cited

U.S. PATENT DOCUMENTS

| | | |
|---|---|---|
| 4,597,487 A | 7/1986 | Crosby et al. |
| 5,541,368 A | 7/1996 | Prinz |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakahima et al. |
| 5,695,846 A | 12/1997 | Lange et al. |
| 5,695,864 A | 12/1997 | Zionczweski |
| 5,732,016 A | 3/1998 | Chen |

(Continued)

FOREIGN PATENT DOCUMENTS

| CA | 2766141 | 1/2011 |
|---|---|---|
| CN | 105706259 | 6/2016 |

(Continued)

OTHER PUBLICATIONS

US 7,026,672 B2, 04/2006, Grandis (withdrawn)
(Continued)

*Primary Examiner* — Fernando Hidalgo

(57) ABSTRACT

Techniques for reading a Multi-Bit Cell (MBC) can include sensing a state parameter value, such as source line voltage, and applying a successive one of N programming parameter values, such as successive programming currents, between instances of sensing the state parameter values. The N successive programming parameter values can be selected to program the state of a corresponding one of N cell elements of the MBC to a respective state parameter value. Successive ones of the sensed state parameter values can be compared to determine N state change results, which can be used to determine the read state of the MBC.

18 Claims, 14 Drawing Sheets

(56) References Cited

U.S. PATENT DOCUMENTS

| | | |
|---|---|---|
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,377 B2 | 3/2006 | Huai et al. |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,166,881 B2 | 1/2007 | Lin |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,724,380 B1 | 5/2014 | Zhou |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |

(56) References Cited

U.S. PATENT DOCUMENTS

| | | |
|---|---|---|
| 9,166,155 B2 | 10/2015 | Deshpande |
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem |
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,317 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,548,445 B2 | 1/2017 | Lee et al. |
| 9,553,102 B2 | 1/2017 | Wang |
| 9,583,167 B2 | 2/2017 | Chung |
| 9,721,632 B2 * | 8/2017 | Houssameddine .......................... G11C 11/1659 |
| 9,728,240 B2 | 8/2017 | Abedifard |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Avin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 10,347,308 B1 | 7/2019 | Bozdag |
| 10,403,343 B2 | 9/2019 | Bozdag |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0278994 A1 | 11/2008 | Katti |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |

(56) References Cited

U.S. PATENT DOCUMENTS

| | | |
|---|---|---|
| 2012/0127804 A1 | 5/2012 | Ong et al. |
| 2012/0134200 A1 | 5/2012 | Khoueir |
| 2012/0155158 A1 | 6/2012 | Higo |
| 2012/0155164 A1 | 6/2012 | Shukh |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0292724 A1 | 11/2012 | Lim |
| 2012/0294078 A1 | 11/2012 | Kent et al. |
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall |
| 2013/0258763 A1 | 10/2013 | Ranjan |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0272059 A1 | 10/2013 | Lin |
| 2013/0275691 A1 | 10/2013 | Chew |
| 2013/0307097 A1 | 11/2013 | Yi et al. |
| 2013/0329488 A1 | 12/2013 | Abedifard |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0131370 A1 | 5/2015 | Zhou |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim |
| 2016/0027999 A1 | 1/2016 | Pinarbasi |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0085692 A1 | 3/2016 | Kwok |
| 2016/0086600 A1 | 3/2016 | Bauer et al. |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0267957 A1* | 9/2016 | Lu .................... G11C 11/161 |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0358778 A1 | 12/2016 | Park et al. |
| 2016/0372656 A1 | 12/2016 | Pinarbasi et al. |
| 2016/0378592 A1 | 12/2016 | Ikegaml et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0076771 A1* | 3/2017 | Stainer .................. G11C 11/15 |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |
| 2019/0006415 A1* | 1/2019 | Li .................... G11C 11/1655 |
| 2019/0165129 A1 | 5/2019 | Zhu |
| 2019/0206939 A1 | 7/2019 | Bozdag |
| 2019/0244649 A1 | 8/2019 | Park et al. |
| 2019/0258417 A1 | 8/2019 | Torng et al. |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |

(56) References Cited

FOREIGN PATENT DOCUMENTS

| | | |
|---|---|---|
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helm Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, Vol, 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp, 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

MULTI-BIT CELL READ-OUT TECHNIQUES

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). The MTJ can include two magnetic layers and a magnetic tunnel barrier layer. One of the magnetic layers can have a fixed magnetic polarization, while the polarization of the other magnetic layer can switch between opposite directions. Typically, if the magnetic layers have the same magnetic polarization the MTJ cell will exhibit a relatively low resistance value corresponding to a '0' bit state; while if the magnetic polarization between the two magnetic layers is antiparallel the MTJ cell will exhibit a relatively high resistance value corresponding to a '1' bit state. Because the data is stored in the magnetization state, MRAM devices are non-volatile memory devices. The state of a MRAM cell can be read by applying a predetermined current through the cell and measuring the resulting voltage, or by applying a predetermined voltage across the cell and measuring the resulting current. The sensed voltage is proportional to the resistance of the cell, the sensed current is inversely proportional to the resistance of the cell, and either of these can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, one technique for increasing the storage capacity is to store more than a single bit of information in each MTJ cell. However, there is a continuing need for improved reading, writing and error correcting techniques for use with Multi-Bit Cells (MBCs) that can store two bits per cell, Triple-Bit Cells (TBCs) that can store three bits per cell, Quad-Bit Cells (QBCs) that can store four bits per cell, and other architectures that can store a plurality of bits of data per cell.

SUMMARY OF THE INVENTION

The present technology may best be understood by referring to the following description and accompanying drawings that are used to illustrate aspects of the present technology directed toward apparatuses and methods for reading Multi-Bit Cells (MBC). In the conventional art, the term "Multi-Bit Cell (MBC)" is used to refer to storage cells that can store two bits of data per cell, and at other time to generally refer to cells that can store two, three, four or more bits of data per cell. Therefore, for the sake of clarity, the term "Multi-Bit Cell (MBC)" as used herein refers to cells that can store two, three, four or more bits of data per cell, including Triple-Bit Cells (TBCs), and Quad-Bit Cells (QBCs).

In one embodiment, a memory device can include MBCs coupled between bit lines and source lines, wherein the MBCs can include two or more cell elements coupled in series with a selector. The cell elements can have different state values. In one instance, the MBCs can include a first and second MTJ element. The first MTJ element can be switched between a first resistance state and a second resistance state. The second MTJ element can be switched between a third resistance state and a fourth resistance state.

A word line circuit, a bit line circuit and a sense circuit can be configured to bias and sense a first instance of a state parameter value, such as a sense voltage generated in response to an applied sense current ($I_{read}$), of the MBC. The word line circuit and the bit line circuit can also be configured to program the MBC using a first set of programming parameters, such as a first switching current ($I_{sw1}$). The word line circuit, bit line circuit and sense circuit can then sense a second instance of the state parameter value, after programming the MBC using the first set of programming parameters. The sense circuit can be configured to compare the second instance of the state parameter value to the first instance of the state parameter value to determine the presence or absence of a state change of the MBC in response to the programming of the MBC using the first set of programming parameters.

The word line circuit, bit line circuit and sense circuit can then sense a third instance of the state parameter value. The word line and bit line circuits can then program the MBC using a second set of programming parameters, such as a second switching current ($I_{sw2}$). The word line, bit line and sense circuit can then sense a fourth instance of the state parameter value, after programming the MBC using the second set of programming parameters. The sense circuit can then compare the fourth instance of the state parameter value to the third instance of the state parameter value to determine the presence or absence of a state change of the MBC in response to the programming of the MBC using the second set of programming parameters.

The sense circuit can also be configured to determine a read state of the MBC based on the determined presence or absence of a state change in response to the first set of programming parameters and the second set of programming parameters. For example, the first switching current ($I_{sw1}$) can be selected to change the state of the first MTJ from the first resistance value to the second resistance value, and the second switching current ($I_{sw2}$) can be selected to change the state of the second MTJ from the third resistance value to the fourth resistance value. In such case, if the presence of a state change in response to both the first set of programming parameters and the second set of programming parameters is determined, then the MBC read state was originally in a "00" state. If the presence of a state change in response to the first set of programming parameters and the absence of a state change in response to the second set of programming parameters is determined, then the MBC read state was originally in a "01" state. If the absence of a state change in response to the first set of programming parameters and the presence of a state change in response to the second set of programming parameters is determined, then the MBC read state was originally in a "10" state. If the absence of a state change in response to both the first and second set of programming parameters is determined, then the MBC read state was originally in a "11."

In another embodiment, a word line circuit, a bit line circuit and a sense circuit can be configured to bias and sense a first instance of a state parameter value, such as a sense voltage generated in response to an applied sense current ($I_{read}$), of the MBC. The word line circuit and the bit line circuit can also be configured to program a first cell of the MBC to a given state using a first set of programming parameters, such as a first switching current ($I_{sw1}$). The word line circuit, bit line circuit and sense circuit can then sense a second instance of the state parameter value, after programming the MBC using the first set of programming parameters. The sense circuit can be configured to compare the second instance of the state parameter value to the first instance of the state parameter value to determine the presence or absence of a state change of the MBC in response to the programming of the MBC using the first set of programming parameters.

The word line circuit, bit line circuit and sense circuit can then sense a third instance of the state parameter value. The word line and bit line circuits can then program the first cell of the MBC to the other state using a second set of programming parameters, such as a second switching current, of magnitude similar to $I_{sw1}$ and opposite sign ($-I_{sw2}$). The word line, bit line and sense circuit can then sense a forth instance of the state parameter value, after programming the MBC using the second set of programming parameters. The sense circuit can then compare the forth instance of the state parameter value to the third instance of the state parameter value to determine the presence or absence of a state change of the MBC in response to the programming of the MBC using the second set of programming parameters.

The sense circuit can also be configured to determine a read state of the MBC based on the determined presence or absence of a state change in response to the first set of programming parameters and the second set of programming parameters. For example, the first switching current ($I_{sw1}$) can be selected to change the state of the first MTJ from the first resistance value to the second resistance value, and the second switching current ($-I_{sw2}$) can be selected to change the state of the first MTJ from the second resistance value to the first resistance value. In such case, if the presence of a state change in response to both the first set of programming parameters and the second set of programming parameters is determined, then the MBC read state was originally in a "00" state. If the presence of a state change in response to the first set of programming parameters and the absence of a state change in response to the second set of programming parameters is determined, then the MBC read state was originally in a "01" state. If the absence of a state change in response to the first set of programming parameters and the presence of a state change in response to the second set of programming parameters is determined, then the MBC read state was originally in a "10" state. If the absence of a state change in response to both the first and second set of programming parameters is determined, then the MBC read state was originally in a "11."

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

FIGS. SA-5D show a diagram illustrating state parameter values and transitions therebetween of a MBC, in accordance with aspects of the present technology.

Figure 6:
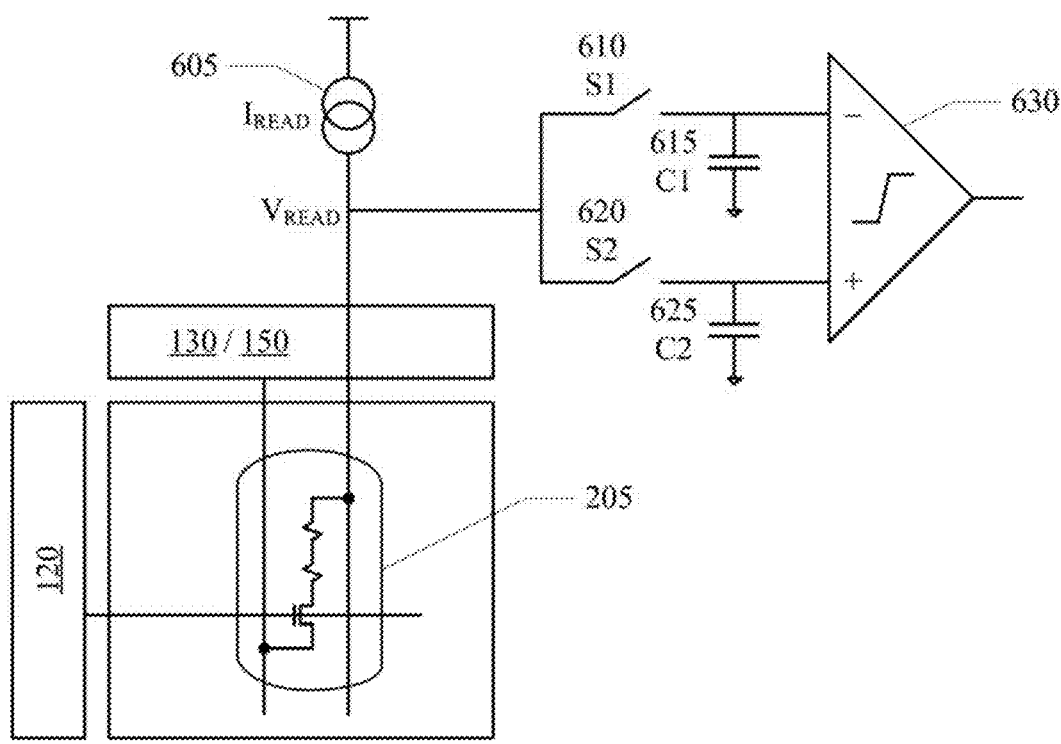

FIG. 6 shows a sense circuit, in accordance with aspects of the present technology.

Figure 7:
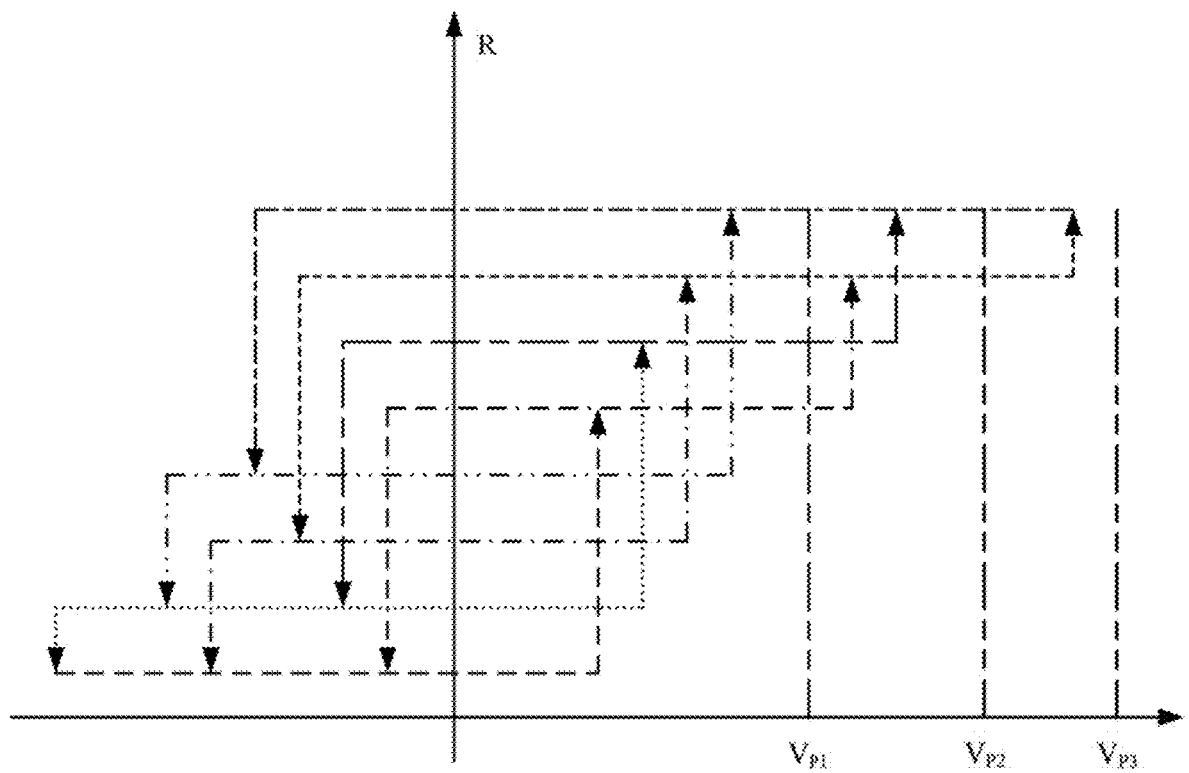

FIG. 7 shows a diagram illustrating state parameter values and transitions therebetween of a MBC, in accordance with aspects of the present technology.

Figure 8:
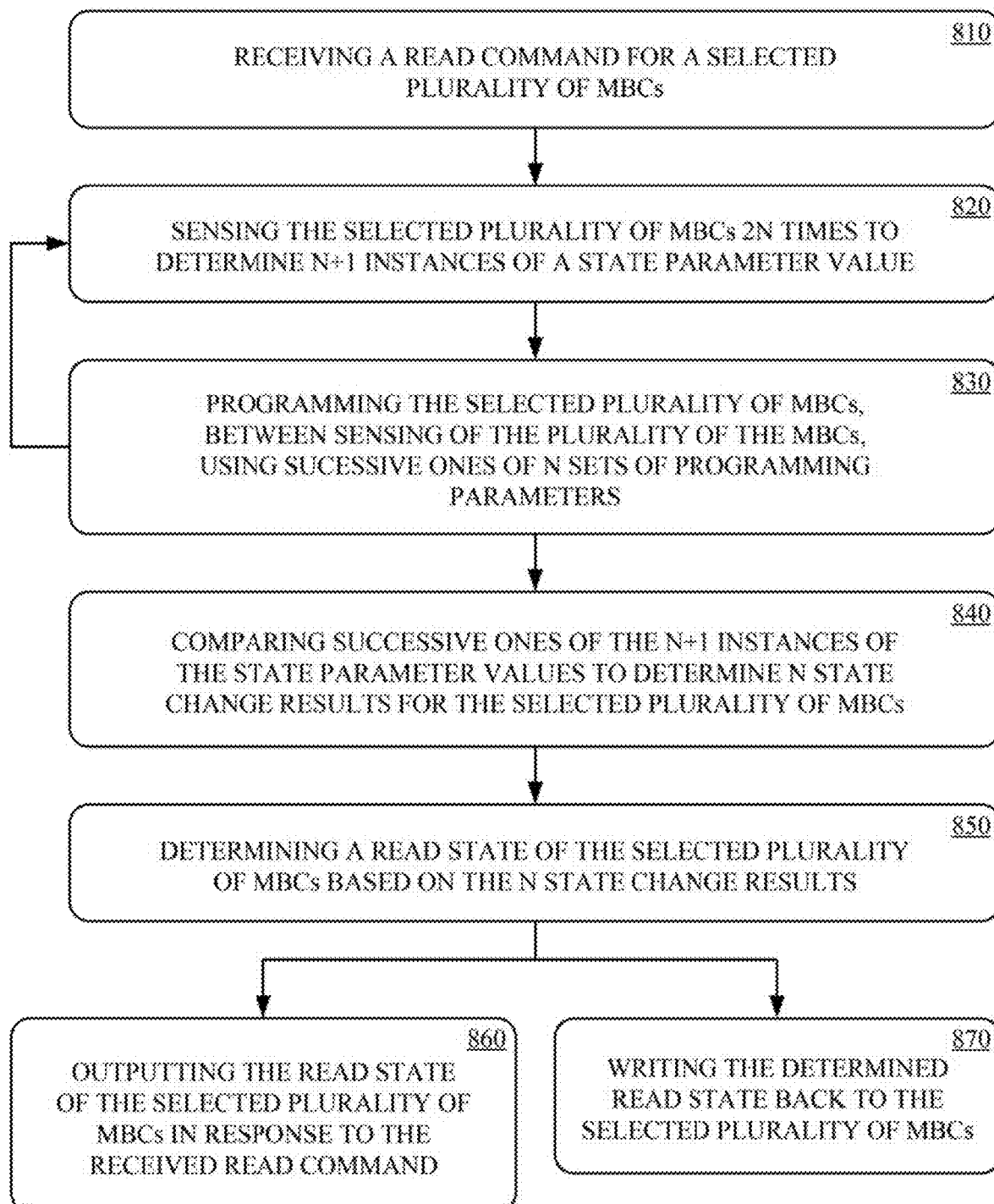

FIG. 8 shows a method of reading a MBC memory device, in accordance with aspects of the present technology.

FIGS. 9A-9D show a diagram illustrating state parameter values and transitions therebetween of a MBC, in accordance with aspects of the present technology.

Figure 10:
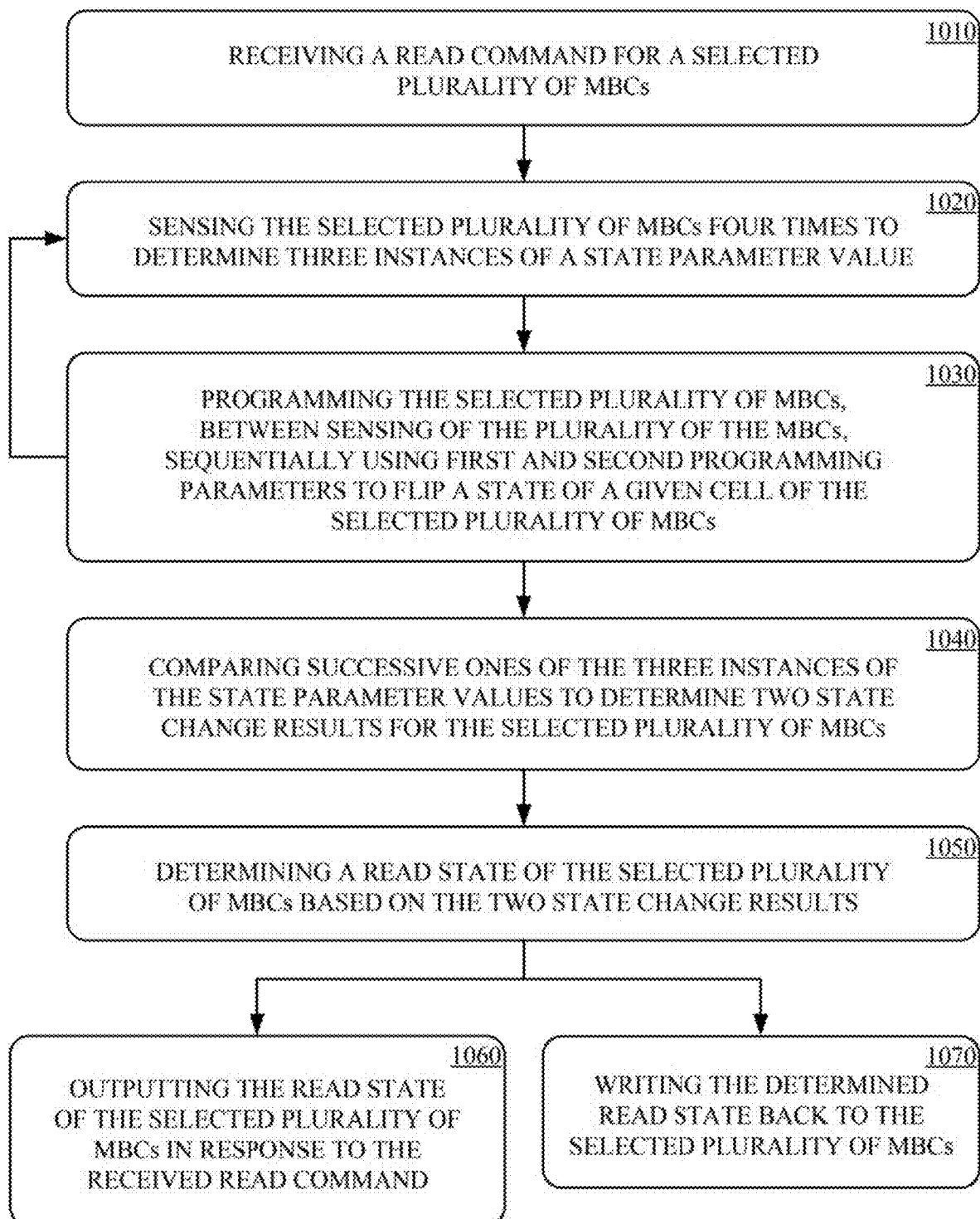

FIG. 10 shows a method of reading a MBC memory device in accordance with aspects of the present technology.

Figure 11:
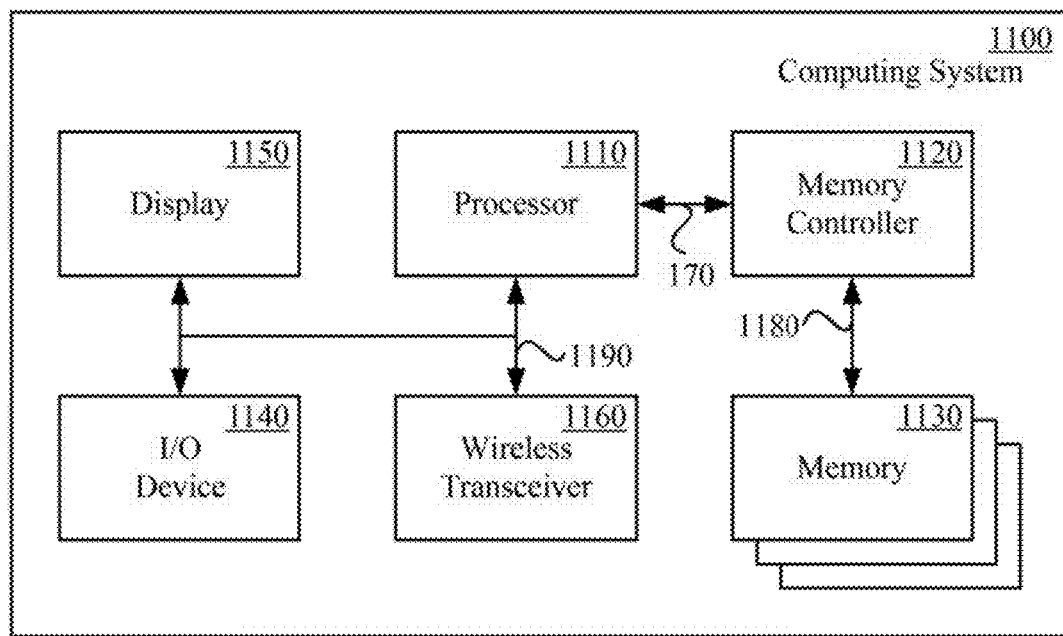

FIG. 11 shows a block diagram of a computing system including a memory device, in accordance with aspects of the present technology.

Figure 12:
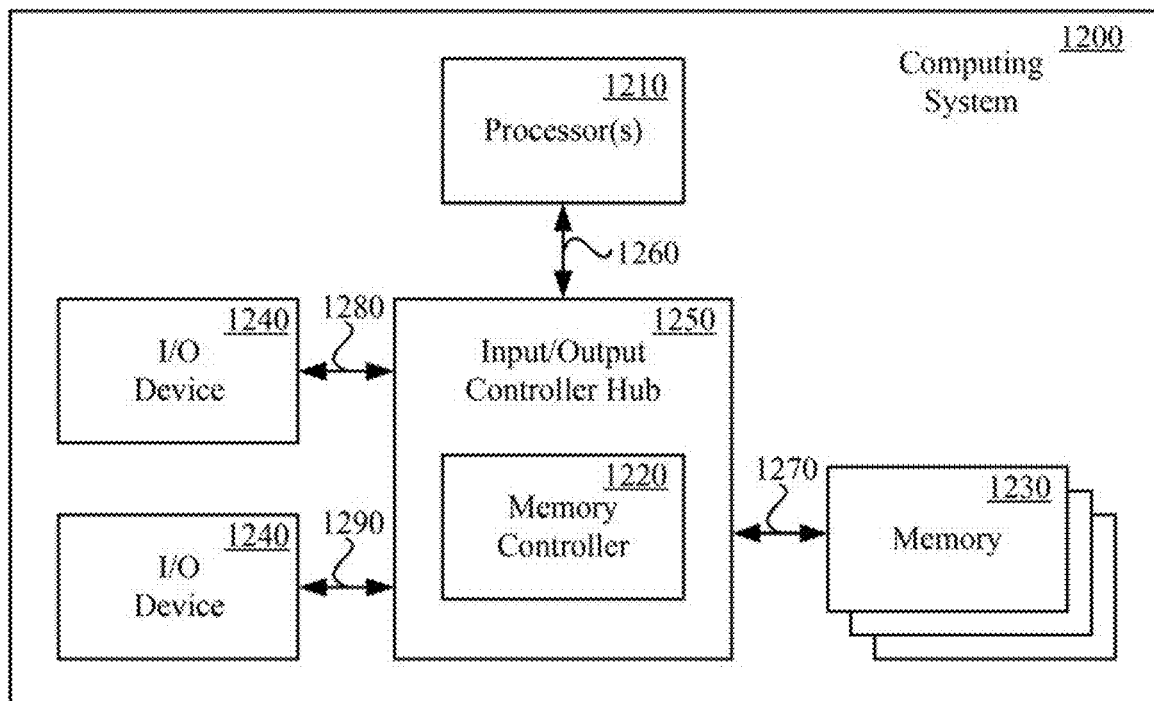

FIG. 12 shows a block diagram of a computing system including a memory device, in accordance with aspects of the present technology.

Figure 13:
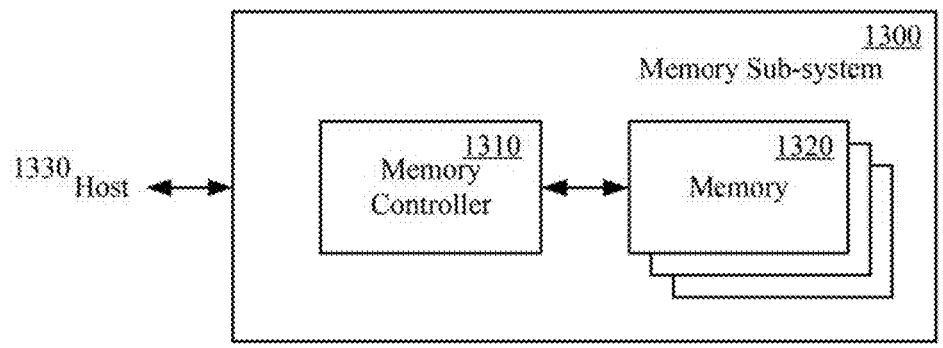

FIG. 13 shows a block diagram of a memory sub-system, in accordance with aspects of the present technology.

Figure 14:
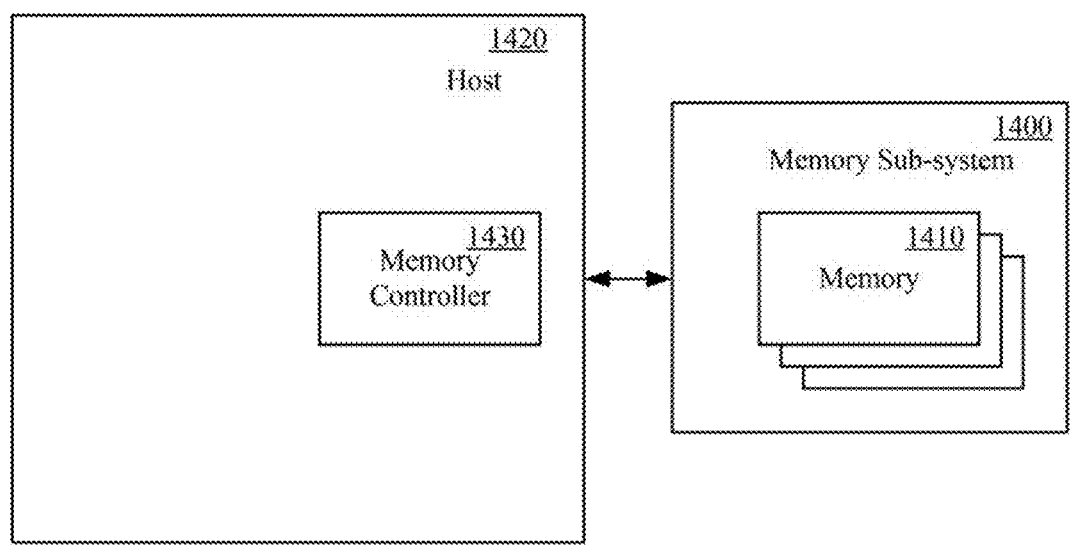

FIG. 14 shows a block diagram of a memory sub-system, in accordance with aspects of the present technology.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic or spintronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic or spintronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

In aspects, a memory cell array can be read by sequentially applying different successive sets of state programming conditions to a selected plurality of the MBCs. The MBCs can include a plurality of cell elements having different sets of state parameter values. A respective set of state programming conditions can program a corresponding one of the plurality of cell elements to a respective state parameter value. After applying each of the sets of programming conditions, a state change result can be determined for the selected plurality of the MBCs. A read state of the selected plurality of MBCs can be determined based the determined state change results. Accordingly, a destructive self-reference sensing technique can be used to read the selected plurality of MBCs. The self-reference technique can be used to reduce the effect of bit-to-bit process variations in the cell elements when reading the MBCs.

Figure 1:
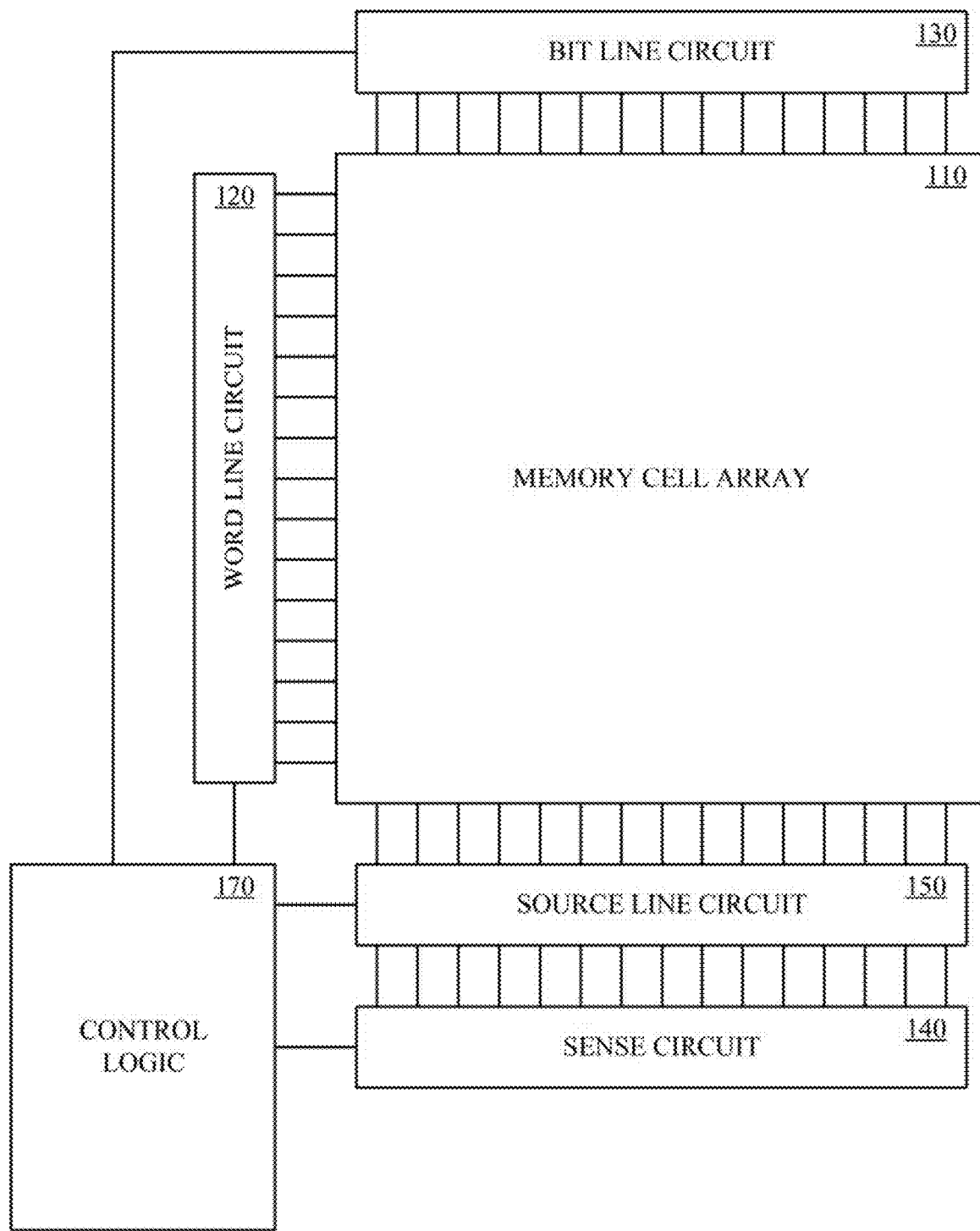
FIG. 1 shows a block diagram of a memory device, in accordance with aspects of the present technology.

Referring to FIG. 1 a block diagram of a memory device, in accordance with aspects of the present technology, is shown. The memory device 100 can include a memory cell array 110 and one or more memory circuits 120-170. The MBCs can include a plurality of cell elements having different sets of state parameter values. The one or more memory circuits 120-170 can be configured for reading and writing to selected groups of MBCs in the memory cell array 110.

Figure 2:
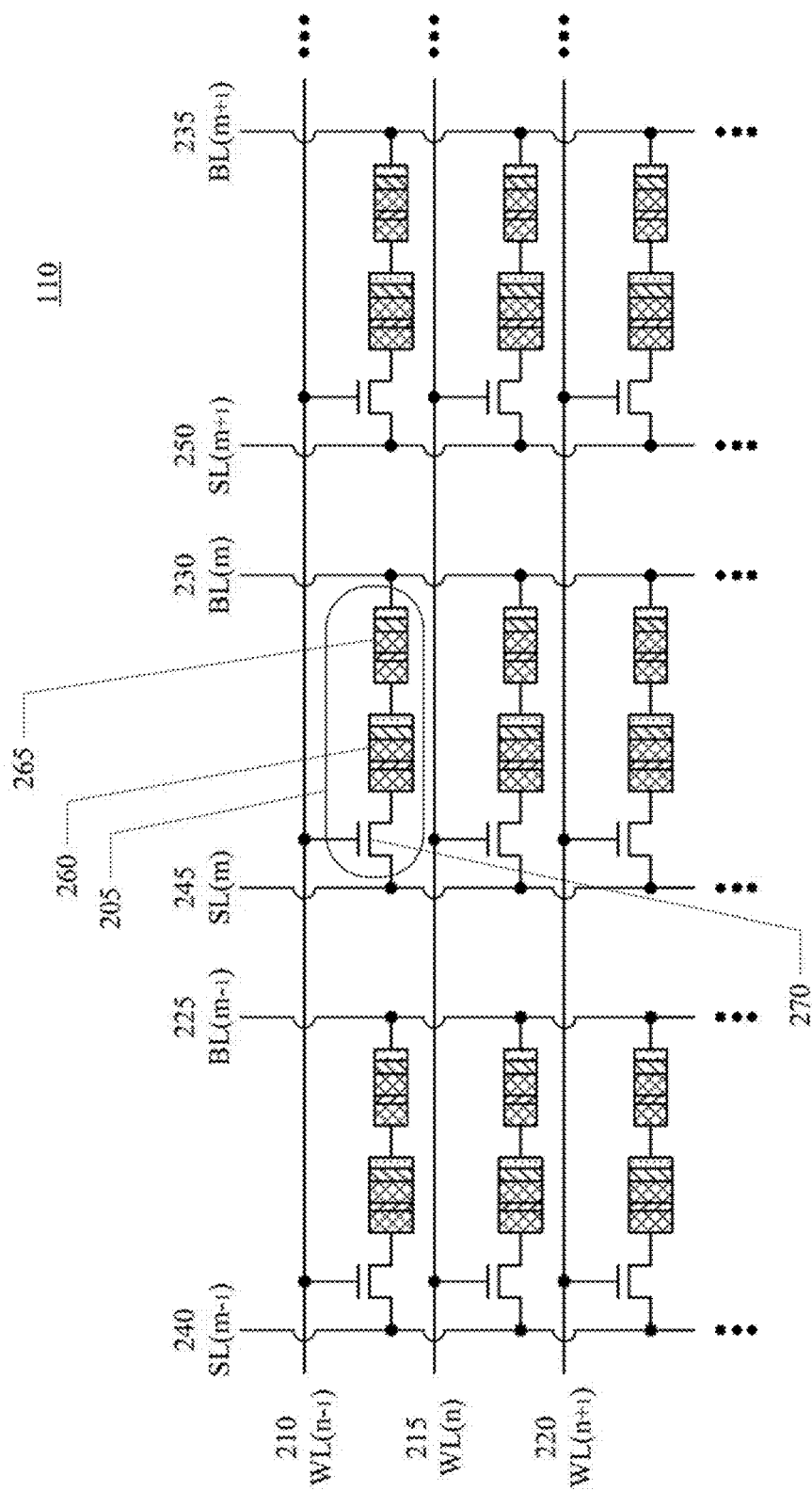
FIG. 2 shows a memory cell array, in accordance with aspects of the present technology.

Referring now to FIG. 2 a memory cell array, in accordance with aspects of the present technology, is shown. In aspects, the memory cell array includes an array of MBCs 205, a plurality of word lines 210-220, a plurality of bit lines 225-235, and a plurality of source lines 240-250. The word lines 210-220 of the memory cell array 200 can be organized along rows of the array. The bit lines 225-235 and source lines 240-250 can be organized along columns of the array. The MBCs 205 can include a plurality of cell elements 260, 265 and a selector element 270 coupled in series between respective word lines 210-220 and respective source lines 240-250. Control gates of the selector elements 270 can be coupled to respective word lines 210-220.

Figure 3A:
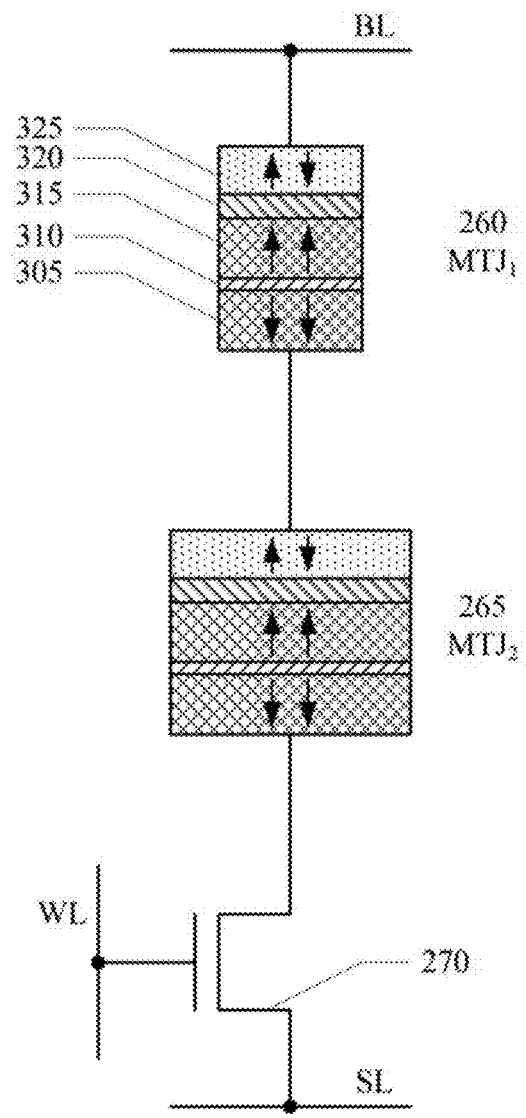
FIGS. 3A and 3B show a Multi-Bit Cell (MBC), in accordance with aspects of the present technology.
Figure 3B:
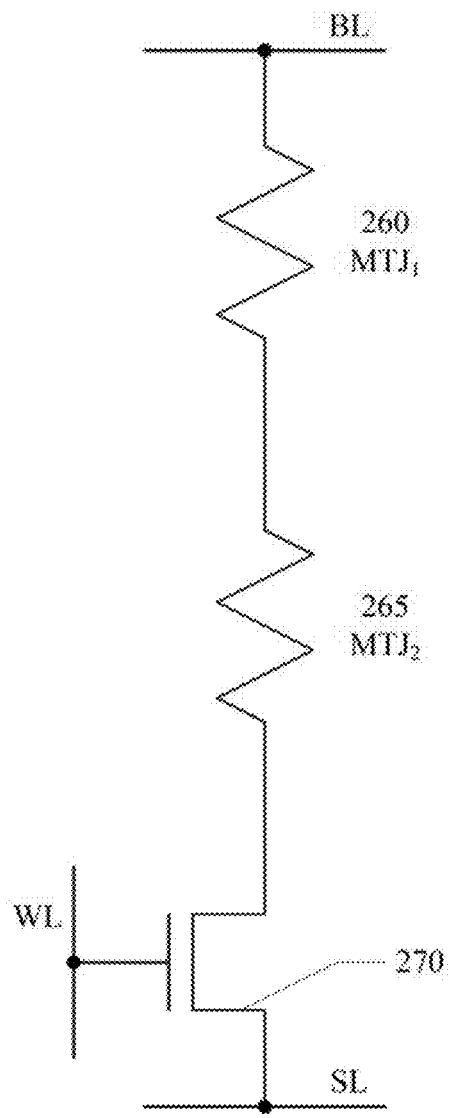

Referring now to FIGS. 3A and 3B, a MBC, in accordance with aspects of the present technology, is shown. The MBC 205 can include a plurality of cell elements 260, 265 and a selector element 270. FIG. 3A illustrates an exemplary structure of Magnetic Tunnel Junction (MTJ) cell elements 260, 265 for a MBC 205 including two cell elements. Each MTJ cell element can include a first fixed magnetic layer 305 having a fixed magnetization polarization, a coupling layer 310, a second fixed magnetic layer 315 that is coupled antiferromagnetically to the first magnetic layer 305 through the coupling layer 310, a magnetic tunnel barrier layer 320 and a free magnetic layer 325 that can be switched between opposite magnetic polarizations.

In one implementation, the magnetic polarization of the first and second fixed magnetic layers 305, 315 can be orientated in opposite directions. The magnetic polarization of the fixed magnetic layer 305 can be configured to fix the direction of the magnetic polarization of the second fixed magnetic layer 315. In one implementation, the orientation of the magnetic polarization of the second fixed magnetic layer 315 can be in the same direction in all of the MTJs 260, 265. In one implementation, the free magnetic layer 325 can be a Cobalt-Iron-Boron (CoFeB) layer, the magnetic tunnel barrier layer 320 can be a Magnesium-Oxide (MgO) layer, the second fixed magnetic layer 315 can be a Cobalt-Iron-Boron (CoFeB) layer, the coupling layer 310 can be a Ruthenium (Ru) layer, and the first fixed magnetic layer 305 can be a Cobalt-Platinum (CoPt) or Cobalt-Nickel (CoNi). One or more additional layers can appear on either side of this structure.

Typically, if the second fixed magnetic layer 315 and free magnetic layer 325 have the same magnetic polarization (e.g., parallel), the MTJ cell element will exhibit a relatively low resistance value (Rp) corresponding to a '0' bit state; while if the magnetization polarization between the two magnetic layers 315, 325 are antiparallel, the MTJ cell will exhibit a relatively high resistance value (Rap) corresponding to a '1' bit state.

FIG. 3B illustrates an exemplary resistive equivalence of the MTJ cell elements 260, 265. For MTJ cell elements 260, 265 the state parameter values can include different sets of resistance values. For example, the first MTJ cell element 260 can have a first low resistance value $R_1p$ and a first high resistance value $R_1ap$, and the second MTJ cell element 265 can have a second low resistance value $R_2p$ and a second high resistance value $R_2ap$, wherein $R_1p \neq R_1ap \neq R_2p \neq R_2ap$. In such case four levels of resistance can be achieved by combining each state of two MTJ cell elements. Each of the MTJ cell elements can have two states, two different threshold currents (Isw) and two different resistance variations ($\Delta R$). In aspects, the difference in the two states, the two different threshold currents and the two difference resistance variations can be obtained by either varying the thermal stability factor of each MTJ cell element 260, 265, by varying a damping parameter of each MTJ cell element's free layer, or by varying the tunnel barrier properties of each MTJ cell element. For example, the thermal stability factor of each MTJ cell element can be varied by variations in the interfacial anisotropy, element size, saturation magnetization, and/or the like.

The four resistance states can be uniquely defined by the combination of the relative magnetization of the two MTJ cell elements. As illustrated in Table 1, an MBC 205, including two MTJ cell elements 260, 265, can have four combinations of resistance values:

TABLE 1

| MTJ1 | MTJ2 | MBC |
|---|---|---|
| $R_1p$ | $R_2p$ | $R_1$ |
| $R_1p$ | $R_2ap$ | $R_2$ |
| $R_1ap$ | $R_2p$ | $R_3$ |
| $R_1ap$ | $R_2ap$ | $R_4$ |

Figure 4A:
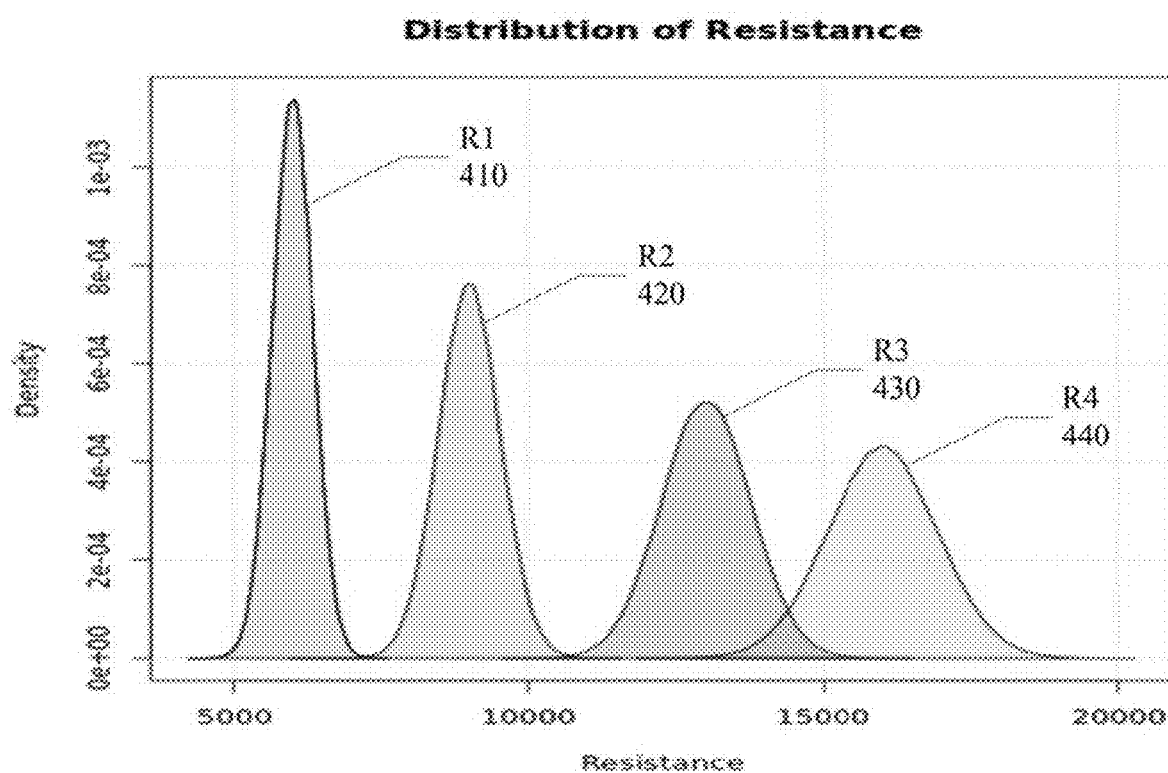
FIGS. 4A and 4B show characteristics of a MBC with a standard state readout scheme, in accordance with aspects of the present technology.

The MBC 205 including two MTJ cell elements 260, 265 can therefore exhibit four resistance values R1, R2, R3 and R4. As illustrated in FIG. 4A, the MBC can have a distribution of resistance values 410-440 for each of the four slates as a result of process variations in the access element 270 and the MTJ cell elements 260, 265. Overlapping of the resistance distribution can result in read errors.

Figure 4B:
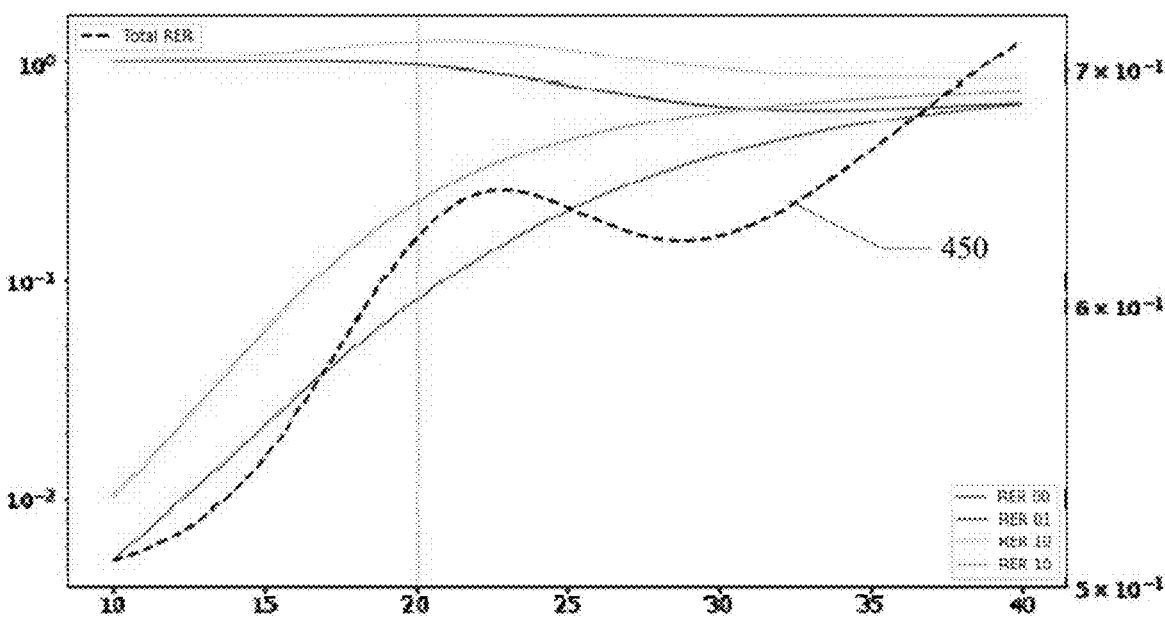

Referring now to FIG. 4B, a graph illustrating an exemplary relationship between the size of an MTJ and read error rate is shown. Although it may seem that the separation between the resistive states can be increased to reduce the overlap between the state, it may not be possible to achieve such a result. As illustrated by the dashed line 450, the Read Error Rate may typically be greater than $10^{-1}$ whenever the size of the MTJ is larger than approximately 20 nm, which is typically not acceptable for commercial implementations.

In aspects, the one or more memory circuits 120-170 can be configured to sequentially apply different successive sets of state programming conditions to a selected plurality of the MBCs 205. In one implementation, the selected plurality of MBCs 205 can be a byte, word, page, code word or the like number of MBCs 205. The respective sets of state programming conditions can program a corresponding one of the plurality of cell elements in the selected plurality of MBCs 205 to a respective state parameter value. In one implementation, a first set of state programming conditions can be selected to change the state of the first cell element 260 from a first state to a second state, without changing the state of the second cell element 265. The second set of state programming conditions can be selected to change the state of the second cell element 265 from a first state to a second state. The second set of state programming conditions can also change the state of the first cell element 260 from a first state to a second state, and therefore, the first set of programming conditions and the second set of programming conditions are sequentially applied.

Figure 5A:
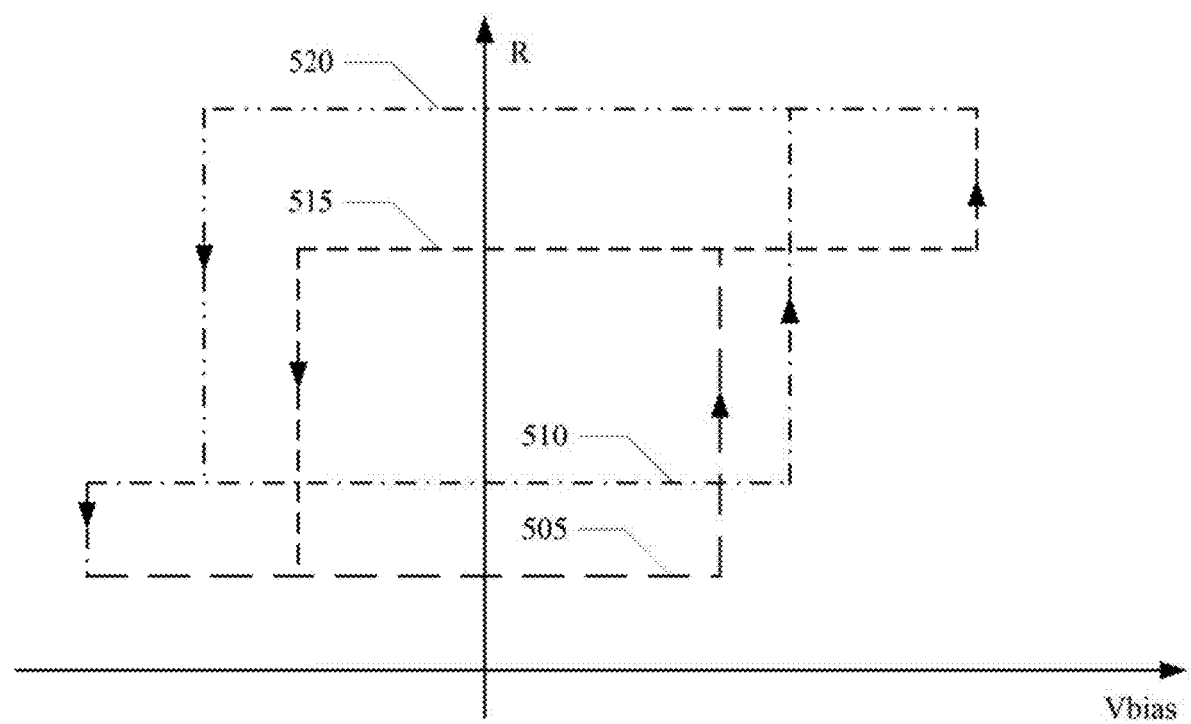
Figure 5B:
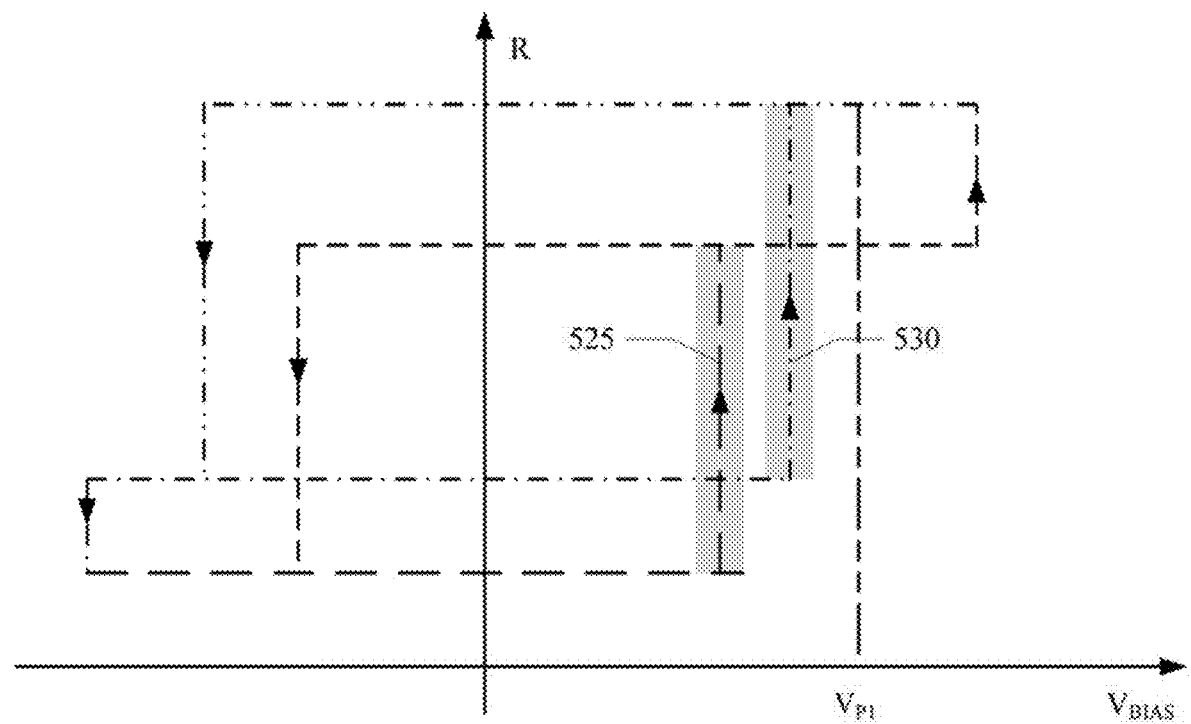
Figure 5C:
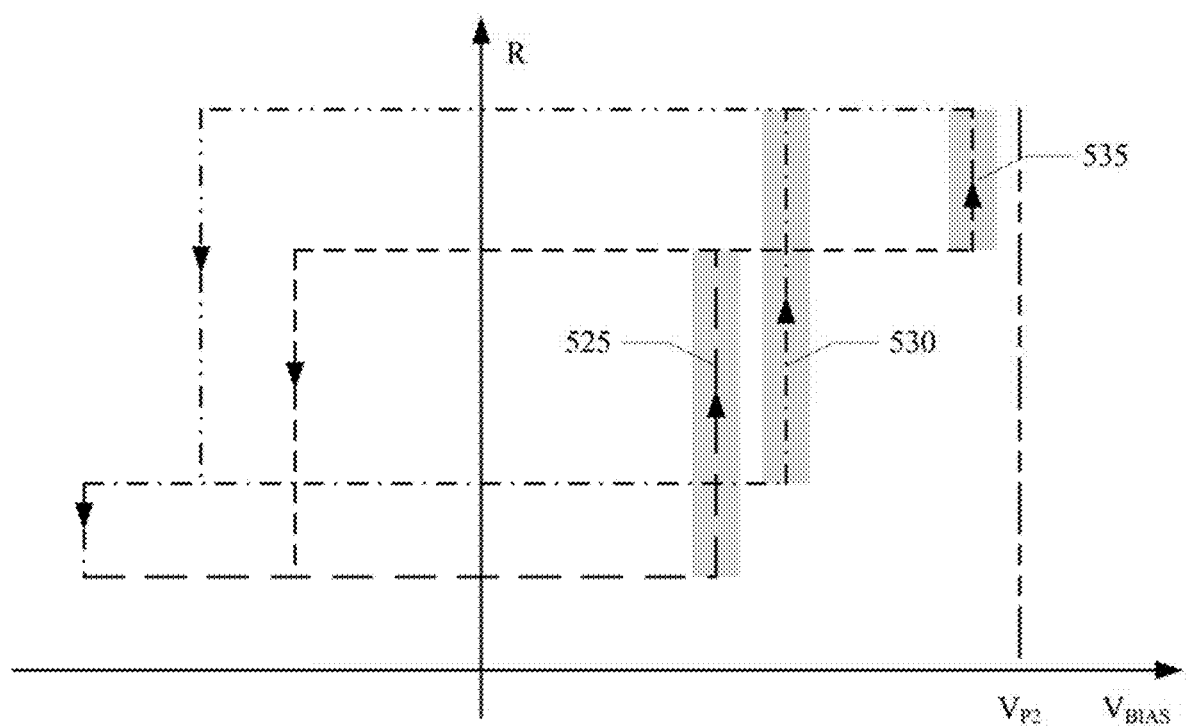
Figure 5D:
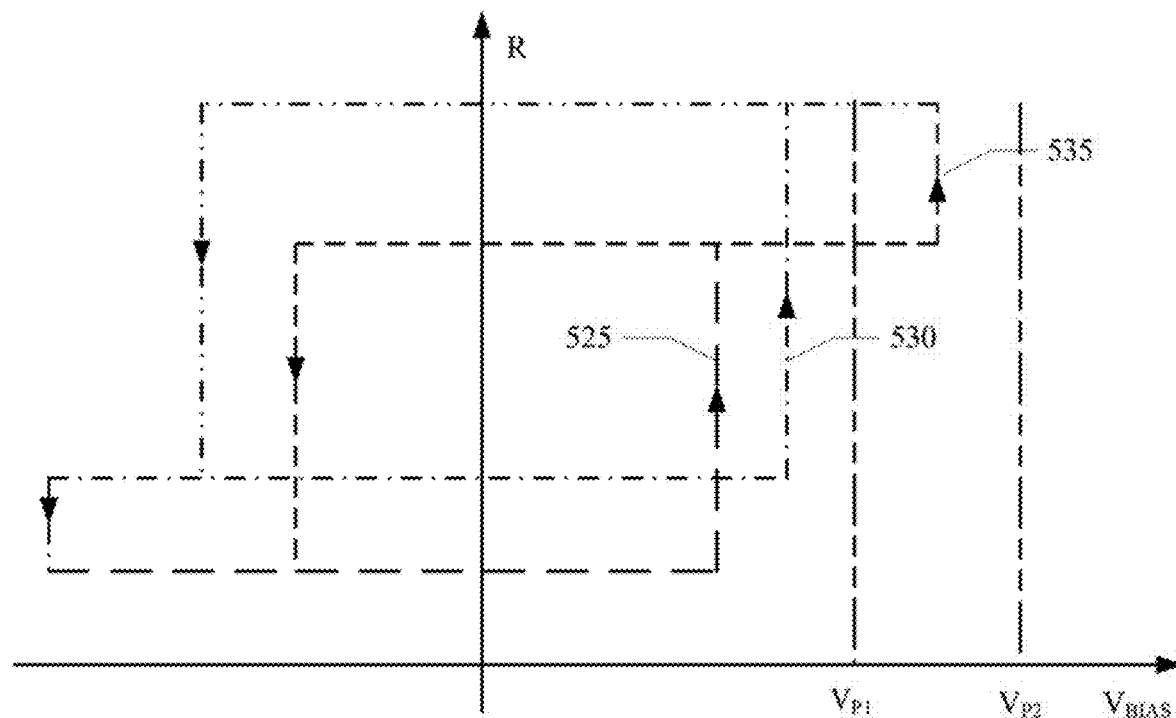

In an exemplary implementation, the MBCs 205 can include a plurality of MTJ cell elements, and the successive sets of state programming conditions can apply a bias voltage to respective word lines, and a bias current to respective bit lines. Each respective set of word line bias voltages and bit line bias currents can program a corresponding one of the plurality of cell elements 260, 265 to a respective resistance state. Referring now to FIGS. 5A-5C, a diagram illustrating state parameter values and transitions therebetween of a MBC, in accordance with aspects of the present technology, is shown. The cell elements of the MBC can have different sets of state parameter values, and therefore the MBC can have unique state parameters and unique transitions therebetween. For example, if the MBC includes a first cell element having resistance states $R_1ap$ and $R_1p$ and a second cell element having resistance states $R_2ap$ and $R_2p$, the MBC can have four unique resistance values $R_1$ 505, $R_2$ 510, $R_3$ 515 and $R_4$ 520. In addition, the transitions between the resistance states can also be unique. For example, a first set of programming voltages ($V_{P1}$) can change the state of the first cell element from the $R_1ap$ state to the $R_1p$ state, but not change the state of the second cell element. If the second cell element is in the $R_2p$ state, the MBC can transition from the $R_1$ state to the $R_3$ state 525. However, if the second cell element is in the $R_2ap$ state, the MBC can transition from the $R_2$ state to the $R_4$ state 530, as illustrated in FIG. 5B. Similarly, a second set of programming voltages ($V_{P2}$) can change the state of the second cell element from the $R_2ap$ state to the $R_2p$ state. In such case, the MBC can transition from any one of states $R_1$, $R_2$, $R_3$ to the $R_4$ state 535, as illustrated in FIG. 5C. Similarly, the MBC can have unique transitions between resistive states in response to successive sets of reverse polarity programming voltages.

Based on the successive sets of state programming conditions applied and the detection of transitions between state parameters, it is possible to determine the read state of the MBC 205. For example, if a state transition 525, 530 is detected in response to the first set of programming voltages ($V_{P1}$) and another state transition 535 is detected in response to the second set of programming voltages ($V_{P2}$), then the MBC read state was originally in the first resistance state $R_1$. If a state transition 525, 530 is detected in response to the first set of programming voltages ($V_{P1}$), but another state transition is not detected in response to the second set of programming voltages ($V_{P2}$), then the MBC read state was originally in the second resistance state $R_2$. If a state transition is not detected in response to the first set of programming voltages ($V_{P1}$), but a state transition 535 is detected in response to the second set of programming voltages ($V_{P2}$), then the MBC read state was originally in the third resistance state $R_3$. If no state transition is detected in response to both the first and second set of programming voltages ($V_{P1}$, $V_{P2}$), then the MBC read state was originally in the fourth resistance state $R_4$. Accordingly, the described destructive self-reference sensing technique can be used to read the selected plurality of MBCs. The self-reference technique can be used to reduce the effects of bit-to-bit process variations in the cell elements when reading the MBCs.

In aspects, the margins between the resistive state transitions 525-535 can be asymmetric. In an MTJ based MBC implementation, the margins between the resistive state transitions can be adjusted by adjusting the fringe fields between the magnetic layers of the individual MTJs of the MBC. In aspects, if a given margin between the resistive state transitions 525-535 is relatively wide, a relatively short programming current pulse can be applied to the MBC. However, if the given margin between the resistive state transitions 525-535 is relatively narrow, a relatively longer programming current pulse can be applied to the MBC.

Referring again to FIG. 1, the one or more memory circuits 120-170 can be configured to determine a state change result for the selected plurality of MBCs after applying each of the set of programming conditions. In one implementation, the state of the MBC can be read before applying a first set of state programming conditions, the state of the MBC can be read after applying the first set of state programming conditions, and then a first state change condition can be determined based on the read state of the MBC before and after applying the first set of state programming conditions. A second set of state programming conditions can be applied, the state of the MBC can be read after applying the second set of state programming conditions, and then a second state change condition can be determined based on the read state of the MBC before and after applying the second set of state programming conditions.

In an exemplary implementation, the one or more memory circuits 120-170 can be configured to bias the bit lines of the selected plurality of MBCs with a sense current and sense a first instance of a source line voltage of the plurality of MBCs. The one or more memory circuits 120-170 can then be configured to apply a first programming current to the selected plurality of MBCs. The one or more memory circuits 120-170 can then be configured to bias the bit lines of the selected plurality of MBCS with the sense current and sense a second instance of the source line voltage of the plurality of MBCs.

The one or more memory circuits 120-170 can be configured to again bias the bit lines of the selected plurality of MBCs with the sense current and sense a third instance of a source line voltage of the plurality of MBCs. The one or more memory circuits 120-170 can then be configured to apply a second programming current to the selected plurality of MBCs. The one or more memory circuits 120-170 can then be configured to bias the bit lines of the selected plurality of MBCs with the sense current and sense a fourth instance of the source line voltage of the plurality of MBCs.

The one or more memory circuits 120-170 can be configured to determine the read state of the selected plurality of MBCs based on a presence or absence of a change between the first instance of the source line voltage and the second instance of the source line voltage, and a presence or absence of a change between the third instance of the source line voltage and the fourth instance of the source line voltage. Accordingly, each MTJ is compared to itself under the same applied bias conditions. Therefore, a better sense margin can be provided and the use of a MTJ reference can be eliminated.

Referring now to FIG. 6, a sense circuit, in accordance with aspects of the present technology, is shown. The sense circuit is described herein with reference to sensing a single MBC 205. However, the sense circuit can be duplicated to sense a byte, a word, a page or the like number of MBCs. The sense circuit can include a current source 605 to apply a fixed current to a MBC 205. A first switch (S1) 610 and a first capacitor (C1) 615 can be coupled together and configured to store the first instance of the sense level of the of the MBC 205, before the cell is sequentially programmed. A second switch (S2) 620 and a second capacitor (C2) 625 can be coupled together and configured to store the second instance of the sense level, after the cell is sequentially programmed. A comparator 630 can be coupled to the first switch 610 and the first capacitor 615, and to the second switch 620 and the second capacitor 625. The comparator 630 can be configured to compare the second instance of the sense level store on the second capacitor 625 to the first instance of the sense level stored on the first capacitor 615.

Determining the read state of the selected plurality of MBCs can be further extended to MBCs including more than two cell elements. Referring now to FIG. 7, a diagram illustrating state parameter values and transitions therebetween of a MBC, in accordance with aspects of the present technology, is shown. In one implementation, a first set of programming parameters ($V_{P1}$) can be selected to change the state of a first cell element, a second set of programming parameters ($V_{P2}$) can be selected to change the state of a second cell element, and a third set of programming parameters ($V_{P3}$) can be selected to change the state of a third cell element. For example, the one or more memory circuits 120-170 can be configured to bias the bit lines of the selected plurality of MBCs with a sense current and sense a first instance of a source line voltage of the selected plurality of MBCs. The one or more memory circuits 120-170 can then be configured to bias the selected plurality of MBCs with a first programming current or programming bias voltage. The one or more memory circuits 120-170 can then be configured to bias the bit lines of the selected plurality of MBCs with the sense current and sense a second instance of the source line voltage of the selected plurality of MBCs.

The one or more memory circuits 120-170 can be configured to bias the bit lines of the selected plurality of MBCs with the sense current and sense a third instance of the source line voltage of the selected plurality of MBCs. The one or more memory circuits 120-170 can then be configured to bias the selected plurality of MBCs with a second programming current or programming bias voltage. The one or more memory circuits 120-170 can then be configured to bias the bit lines of the selected plurality of MBCs with the sense current and sense a fourth instance of the source line voltage of the selected plurality of MBCs.

The one or more memory circuits 120-170 can be configured to bias the bit lines of the selected plurality of MBCs with the sense current and sense a fifth instance of the source line voltage of the selected plurality of MBCs. The one or more memory circuits 120-170 can then be configured to bias the selected plurality of MBCs with a third programming current or programming bias voltage. The one or more memory circuits 120-170 can then be configured to bias the bit lines of the selected plurality of MBCs with the sense current and sense a sixth instance of the source line voltage of the selected plurality of MBCs.

The one or more memory circuits 120-170 can be configured to determine the read state of the selected plurality of MBCs based on a presence or absence of a change between the first and second instances of the source line voltage, a presence or absence of a change between the third and fourth instances of the source line voltage, and a presence or absence of a change between the fifth and sixth instances of the source line voltage.

Referring now to FIG. 8, a method of reading a Multi-Bit Cell (MBC) memory device, in accordance with aspects of the present technology, is shown. The memory device can include an array of MBCs and one or more memory circuits. The MBCs can include a number (N) of cell elements coupled in series. The cell elements can have two different states, such that the MBCs have $2^N$ states. In one implementation, each MBC can include a number (N) of MTJ cell elements coupled in series. The MTJ cells can be in a first or second one of two possible states.

In aspects, the memory device can receive a read command for a selected plurality of MBCs, at 810. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs N+1 times to determine N+1 instance of a state parameter value, at 820. The memory device can program the selected plurality of MBCs, between sensing of the selected plurality of the MBCs, using successive ones of N sets of programming parameters, at 830. In one implementation, a first one of the sets of programming parameters can be selected to switch a first one of the plurality of cell elements from one state to the other state of the first cell element. A second one of the sets of programming parameters can be selected to switch a second one of the cell elements from one state to the other state of the second cell element. For MBCs including additional cell elements, successive ones of the N sets of programming parameter can be selected to switch successive ones of the cell elements.

In an exemplary implementation, the MBCs can include N MTJs coupled in series. The selected plurality of MBCs can be biased with a sense current, and a first instance of a resulting voltage can be sensed. A first programming current can then be applied to the selected plurality of MBCs. The selected plurality of MBCs can then be biased with a sense current, and a second instance of the resulting voltage can be sensed. The selected plurality of MBCs can continue to be programmed using successive programming currents for a total of N times, and sensed to detect N+1 corresponding instances of the sense voltage. The successive programming currents can be selected to sequentially program each of the N MTJs to corresponding known states.

The memory device can compare successive ones of the N+1 instances of the state parameter value to determine N state change results for the selected plurality of MBCs, at 840. In one instance, the first instance of the sense voltage can be compared with the second instance of the sense voltage to determine the presence or absence of a change in the sense voltage. The memory device can determine a read state of the selected plurality of MBCs based on the N state change results, at 850. The read state of the selected plurality of MBCs can be determined from the unique combination of the results of the N state change determinations. In an exemplary implementation, a lookup table, as illustrated in Table 2, can be accessed to map the state change determination results to a given read state of the MBC.

TABLE 2

| State Change in Response to 1$^{st}$ Set of Programming Parameters | State Change in Response to 2$^{nd}$ Set of Programming Parameters | Read State of MBC |
|---|---|---|
| N | N | 11 |
| Y | N | 10 |
| N | Y | 01 |
| Y | Y | 00 |

The memory device can output the read state of the selected plurality MBCs in response to the received read command, at 860. The memory device can also write the determined read state back to the selected plurality of MBCs, at 870. The read operation is a destructive read as a result of the successive programming of the selected plurality of MBCs at 830. Therefore, the determined read state can be written back to the selected plurality of MBCs to restore the state of the MBCs to their original state prior to the read operation.

Figure 9A:
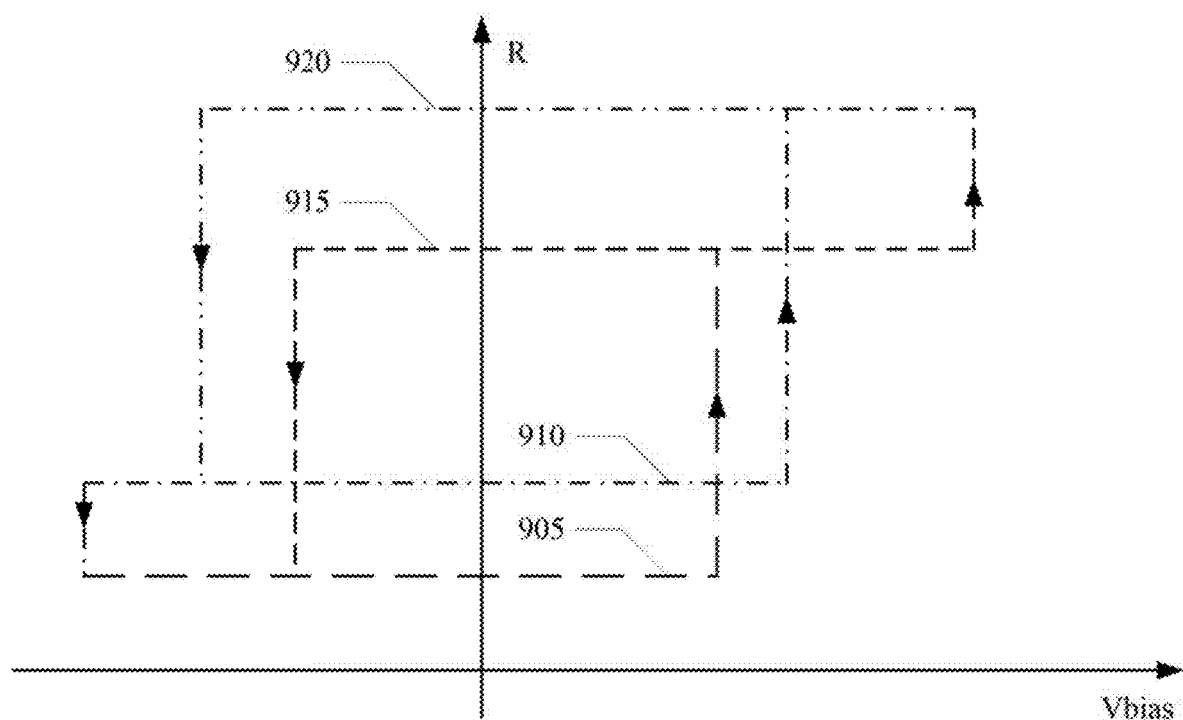
Figure 9B:
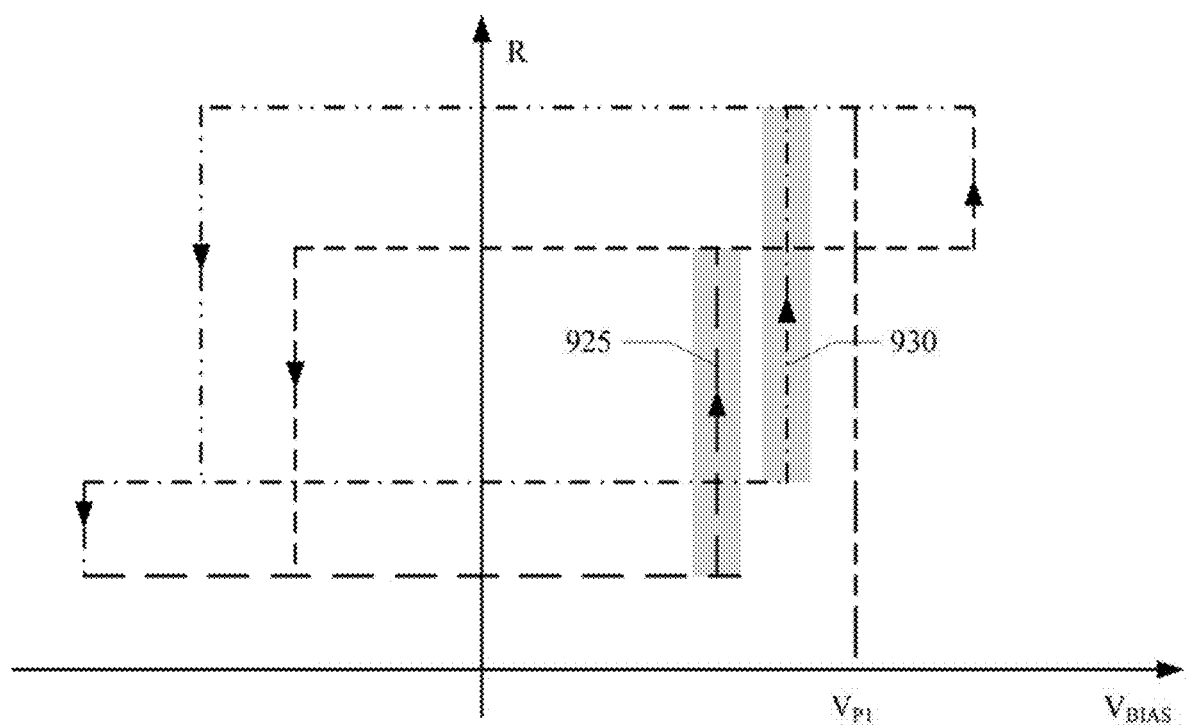
Figure 9C:
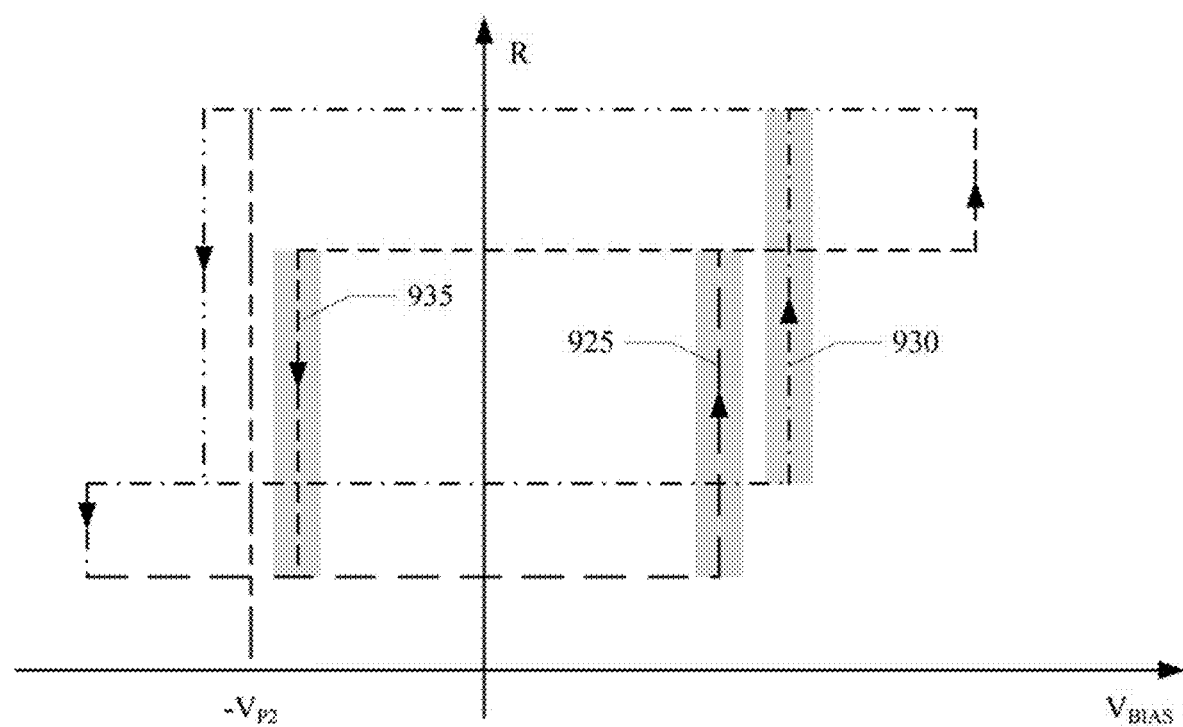

Referring now to FIGS. 9A-D, a diagram illustrating state parameter values and transitions therebetween of a MBC, in accordance with aspects of the present technology, is shown. Again, the cell elements of the MBC can have different sets of state parameter values, and therefore the MBC can have unique state parameters and unique transitions therebetween. For example, if the MBC includes a first cell element having resistance states $R_1ap$ and $R_1p$ and a second cell element having resistance states $R_2ap$ and $R_2p$, the MBC can have four unique resistance values $R_1$ 595, $R_2$ 910, $R_3$ 915 and $R_4$ 920. In addition, the transitions between the resistance states can also be unique. For example, a first set of programming voltages ($V_{P1}$) can change the state of the first cell element from the $R_1ap$ state to the $R_1p$ state, but not change the state of the second cell element. If the second cell element is in the $R_2p$ state, the MBC can transition from the $R_1$ state to the $R_3$ state 925. However, if the second cell element is in the $R_2ap$ state, the MBC can transition from the $R_2$ state to the $R_4$ state 930, as illustrated in FIG. 9B. Similarly, a second set of programming voltages ($-V_{P2}$) can change the state of the first cell element from the $R_1p$ state back to the $R_1ap$ state, but not change the state of the second cell element. If the second cell element is in the $R_2p$ state, the MBC can transition from the $R_3$ state to the R1 state 930, as illustrated in FIG. 9C. However, if the second cell is in the $R_2ap$ state, the MBC cannot transition from the $R_4$ state to the R2 state.

Based on the successive sets of state programming conditions applied to flip a given cell and the detection of transitions between state parameters, it is possible to determine the read state of the MBC 205. In one implementation, the given cell can be the smaller of the two MTJ cells that is flipped to read the state of the MBC 205. For example, if a state transition 925, 930 is detected in response to the first set of programming voltages ($V_{P1}$) and another state transition 935 is detected in response to the second set of programming voltages ($-V_{P2}$), then the MBC read state was originally in the first resistance state $R_1$. If a state transition 925, 930 is detected in response to the first set of programming voltages ($V_{P1}$), but another state transition is not detected in response to the second set of programming voltages ($-V_{P2}$), then the MBC read state was originally in the second resistance state $R_2$. If a state transition is not detected in response to the first set of programming voltages ($V_{P1}$), but a state transition 935 is detected in response to the second set of programming voltages ($-V_{P2}$), then the MBC read state was originally in the third resistance state $R_3$. If no state transition is detected in response to both the first and second set of programming voltages ($V_{P1}$, $-V_{P2}$), then the MBC read state was originally in the fourth resistance state $R_4$. Accordingly, the described destructive resistance toggling sensing technique can be used to read the selected plurality of MBCs. The resistance toggling technique can be used to reduce the effects of bit-to-bit process variations in the cell elements when reading the MBCs.

Figure 9D:
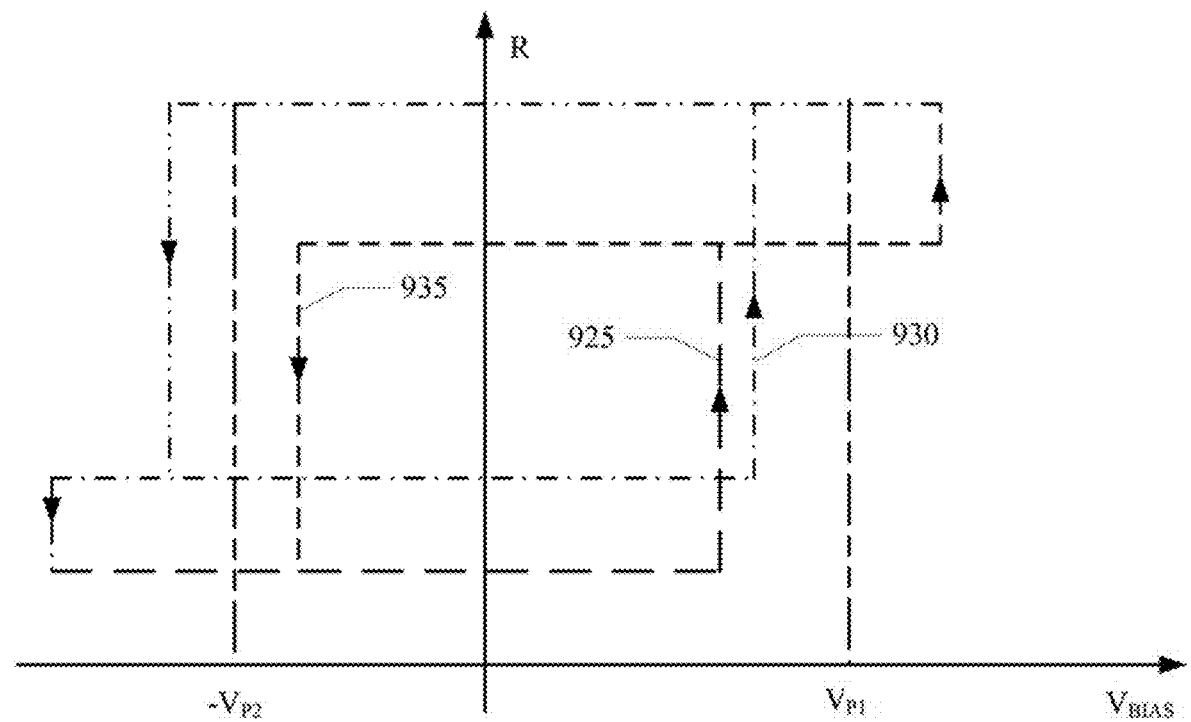

In aspects, the margins between the resistive state transitions 925-935 can be asymmetric. In an MTJ based MBC implementation, the margins between the resistive state transitions can be adjusted by adjusting the fringe fields between the magnetic layers of the individual MTJs of the MBC, as illustrated in FIG. 9D. In aspects, if a given margin between the resistive state transitions 925-935 is relatively wide, a relatively short programming current pulse can be applied to the MBC. However, if the given margin between the resistive state transitions 925-935 is relatively narrow, a relatively longer programming current pulse can be applied to the MBC.

Referring again to FIG. 1, the one or more memory circuits 120-170 can be configured to determine a state change result for the selected plurality of MBCs after applying each of the set of programming conditions to toggle a given cell. In one implementation, the state of the MBC can be read before applying a first set of state programming conditions to program the given cell to a first known state, the state of the MBC can be read after applying the first set of state programming conditions, and then a first state change condition can be determined based on the read state of the MBC before and after applying the first set of state programming conditions. A second set of state programming conditions can be applied to program the given cell to a second known state, the state of the MBC can be read after applying the second set of state programming conditions, and then a second state change condition can be determined based on the read state of the MBC before and after applying the second set of state programming conditions.

In an exemplary implementation, the one or more memory circuits 120-170 can be configured to bias the bit lines of the selected plurality of MBCs with a sense current and sense a first instance of a source line voltage of the plurality of MBCs. The one or more memory circuits 120-170 can then be configured to apply a first programming current to the selected plurality of MBCs to program the first cell to a first state. The one or more memory circuits 120-170 can then be configured to bias the bit lines of the selected plurality of MBCs with the sense current and sense a second instance of the source line voltage of the plurality of MBCs.

The one or more memory circuits 120-170 can be configured to again bias the bit lines of the selected plurality of MBCs with the sense current and sense a third instance of a source line voltage of the plurality of MBCs. The one or more memory circuits 120-170 can then be configured to apply a second programming current to the selected plurality of MBCs to program the first cell to a second state. In one implementation, the duration of the first and second programming current pulses are relatively long, with the second programming current pulse being longer than the first programming current pulse. The one or more memory circuits 120-170 can then be configured to bias the bit lines of the selected plurality of MBCs with the sense current and sense a fourth instance of the source line voltage of the plurality of MBCs.

The one or more memory circuits 120-170 can be configured to determine the read state of the selected plurality of MBCs based on a presence or absence of a change between the first instance of the source line voltage and the second instance of the source line voltage, and a presence or absence of a change between the third instance of the source line voltage and the fourth instance of the source line voltage. Accordingly, each MTJ is compared to itself under the same applied bias conditions. Therefore, a better sense margin can be provided and the use of a MTJ reference can be eliminated.

Referring now to FIG. 10, a method of reading a Multi-Bit Cell (MBC) memory device, in accordance with aspects of the present technology, is shown. The memory device can include an array of MBCs and one or more memory circuits. The MBCs can include two cell elements coupled in series. The cell elements can have two different states, such that the MBCs have four states. In one implementation, each MBC can include two MTJ cell elements coupled in series. The MTJ cells can be in a first or second one of two possible states.

In aspects, the memory device can receive a read command for a selected plurality of MBCs, at 1010. The read command can be received from a processing unit, such as a central processing unit (CPU), a graphics processing unit (GPU), digital signal processor (DSP), micro-controller or the like. The selected plurality of MBCs can be a computing device readable byte, word, page, code word, of the like portion of the MBC array.

In aspects, the memory device can sense the selected plurality of MBCs four times to determine three instance of a state parameter value, at 1020. The memory device can program the selected plurality of MBCs, between sensing of the selected plurality of the MBCs, sequentially using a first set of programming parameters and then a second set of programming parameters to flip a state of a given cell of the selected plurality of MBCs, at 1030. In one implementation, a first one of the sets of programming parameters can be selected to program a first one of the plurality of cell elements to a known state. A second one of the sets of programming parameters can be selected to switch the first one of the cell elements from the known state to the other state.

The memory device can compare successive ones of the three instances of the state parameter value to determine two state change results for the selected plurality of MBCs, at 1040. In one instance, the first instance of the sense voltage can be compared with the second instance of the sense voltage to determine the presence or absence of a change in the sense voltage. The memory device can determine a read state of the selected plurality of MBCs based on the two state change results, at 1050. The read state of the selected plurality of MBCs can be determined from the unique combination of the results of the two state change determinations. In an exemplary implementation, a lookup table, as illustrated in Table 3, can be accessed to map the state change determination results to a given read state of the MBC.

TABLE 3

| State Change in Response to $1^{st}$ Set of Programming Parameters | State Change in Response to $2^{nd}$ Set of Programming Parameters | Read State of MBC |
| --- | --- | --- |
| N | N | 11 |
| Y | N | 10 |
| N | Y | 01 |
| Y | Y | 00 |

The memory device can output the read state of the selected plurality MBCs in response to the received read command, at 1060. The memory device can also write the determined read state back to the selected plurality of MBCs, at 1070. The read operation is a destructive read as a result of the successive programming of the selected plurality of MBCs at 1030. Therefore, the determined read state can be written back to the selected plurality of MBCs to restore the state of the MBCs to their original state prior to the read operation.

Referring now to FIG. 11, a block diagram of a computing system including a memory device, in accordance with aspects of the present technology, is shown. The computing system 1100 can, for example, be a cellular telephone, smart phone, e-reader, table personal computer (PC), laptop PC, desktop PC, gaming console, workstation, server computer, or other similar computing device. The computing system 1100 can include one or more processors 1110, one or more memory controllers 1120, one or more memory devices 1130, and one or more input/output devices 1140. The one or more input/output device 1140 can include, for example, a display 1150, a wireless transceiver 1160 and the like. The computing system 1100 can also include other sub-circuits that are not necessary for an understanding of the present technology and therefore are not discussed herein.

The one or more memory controllers 1120 can be operable to control access to data stored in the one or more memory devices 1130 for use by the one or more processors 1110, one or more input/output devices 1140 and/or other sub-systems of the computing system 1100 communicatively coupled together by one or more buses 1170-1190. The one or more memory controllers 1120 can generate commands for reading and writing of data in the one or more memory devices 1130 in response to memory requests received from the one or more processors 1110, one or more input/output devices 1140 and/or other sub-systems. One or more of the memory devices 1130 can include the MBC array as described herein. In one implementation, the one or more memory devices 10 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Referring now to FIG. 12, a block diagram of a computing system including a memory device, in accordance with aspects of the present technology, is shown. The computing system 1200 can, for example, be a cellular telephone, smart phone, e-reader, table personal computer (PC), laptop PC, desktop PC, gaming console, workstation, server computer, or other similar computing device. The computing system 1200 can include one or more processors 1210, one or more memory controllers 1220, one or more memory devices 1230, and one or more input/output devices 1240 that can be communicatively coupled together by one or more input/output controller hubs 1250 through one or more buses 1260-1290. The computing system 1200 can also include other sub-circuits that are not necessary for an understanding of the present technology and therefore are not discussed herein.

The one or more memory controllers 1220 can be integral to one or more other sub-circuits such as the one or more input/output controller hubs 1250 and/or memory devices 1230, or can be implemented as a separate sub-circuit. The one or more memory controllers 1220 can be operable to control access to data stored in the one or more memory devices 1230 for use by the one or more processors 1210, one or more input/output devices 1240 and/or other sub-systems of the computing system 1200. The one or more memory controllers 1220 can generate commands for reading and writing of data in the one or more memory devices 1230 in response to memory requests received from the one or more processors 1210, one or more input/output devices 1240 and/or other sub-systems. One or more of the memory devices 1230 can include the MBC array as described herein. In one implementation, the one or more memory devices 1230 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Referring now to FIG. 13, a block diagram of a memory sub-system, in accordance with aspects of the present technology, is shown. The memory sub-system 1200 can include one or more memory controllers 1310 and one or more memory devices 1320. The memory sub-system 1300 can be a memory expansion card, Solid State Drive (SSD), or the like that is configurable to be coupled to a host device 1330 such as a cellular telephone, smart phone, e-reader, table personal computer (PC), laptop PC, desktop PC, gaming console, workstation, server computer, or other similar computing device. The memory sub-system 1300 can be coupled to the host device 1330 as in internal or external peripheral device.

The one or more memory controllers 1310 can be operable to control access to data stored in the one or more memory devices 1320 for use by the host device 1330. The one or more memory controllers 1310 can generate commands for reading and writing of data in the one or more memory devices 1320 in response to memory requests received from the host device 1330. One or more of the memory devices 1320 can include the MBC array as described herein. In one implementation, the one or more memory devices 1320 can be a MBC Magnetoresistive Random Access Memory (MRAM), MBC cross-point MRAM, MBC Spin Transfer Torque Magnetoresistive Random Access Memory (STT-MRAM), MBC cross-point STT-MRAM, MBC Phase Change Memory (PCM), MBC cross-point PCM, or the like.

Referring now to FIG. 14, a block diagram of a memory sub-system, in accordance with aspects of the present technology, is shown. The memory sub-system 1400 can include one or more memory devices 1410. The memory sub-system 1400 can be a memory expansion card, Solid State Drive (SSD), or the like that is configurable to be coupled to a host device 1420 such as a cellular telephone, smart phone, e-reader, table personal computer (PC), laptop PC, desktop PC, gaming console, workstation, server computer, or other similar computing device. The host device 1420 can include one or more memory controllers 1430. The memory sub-system 1400 can be coupled to the host device 1420 as in internal or external peripheral device.

The one or more memory controllers 1430 can be operable to control access to data stored in the one or more memory devices 1410 for use by the host device 1420. The one or more memory controllers 1430 can generate commands for reading and writing of data in the one or more memory devices 1410 in response to memory requests received from the host device 1420. One or more of the memory devices 1410 can include the MBC array as described herein. In one implementation, the one or more memory devices 1410 can be a MBC Magnetoresistive Random Access Memory (MRAM), MBC cross-point MRAM. MBC Spin Transfer Torque Magnetoresistive Random Access Memory (STT-MRAM), MBC cross-point STT-MRAM, MBC Phase Change Memory (PCM), MBC cross-point PCM, or the like.

The computing systems and memory sub-systems of FIG. 11-14 are illustrative of exemplary embodiments, and are not intended to limit aspects of the present technology. The MBC devices as described herein can be readily applied to any number of conventional memory devices, memory sub-systems, and/or computing systems, along with memory devices, memory sub-systems, and/or computing systems to be developed in the future. In addition, aspects of the present technology have been described with reference to MTJ based MBCs. However, aspects of the present technology can be similarly applied to other MBC architectures, such as Phase Change Memories (PCM), as well as other similar memory architecture to be developed in the future.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory device comprising:
an array of Multi-Bit Cells (MBCs), the MBCs including a plurality of cell elements having different sets of state parameter values;
one or more memory circuits configured to;
sequentially apply different successive sets of state programming conditions to a selected plurality of the MBCs, wherein a respective set of state programming conditions programs a corresponding one of the plurality of cell elements to a respective state parameter value;
determine, after applying each of the set of programming conditions, a state change result for the selected plurality of the MBCs; and
determine a read state of the selected plurality of MBCs based on the determined state change results.

2. The memory device of claim 1, wherein the MBCs includes a first Magnetic Tunnel Junction (MTJ) element and a second MTJ element.

3. The memory device of claim 2, wherein the one or more memory circuits include:
a word line circuit, a bit line circuit and a source line circuit configured to bias the selected plurality of MBCs with a first set of sense voltage or current levels, and a sense circuit to sense a first instance of a sense level of the selected plurality of MBCs;
the word line circuit, the bit line circuit and the source line circuit configured to bias the selected plurality of MBCs with a first set of program voltage or current levels;
the word line circuit, the bit line circuit and the source line circuit configured to bias the selected plurality of MBCs with the first set of sense voltage or current levels, and the sense circuit to sense a second instance of the sense level of the selected plurality of MBCs;
the word line circuit, the bit line circuit and the source line circuit configured to bias the selected plurality of MBCs with a second set of sense voltage or current levels, and the sense circuit to sense a third instance of the sense level of the selected plurality of MBCs;
the word line circuit, the bit line circuit and the source line circuit configured to bias the selected plurality of MBCs with a second set of program voltage or current levels;
the word line circuit, the bit line circuit and the source line circuit configured to bias the selected plurality of MBCs with the second set of sense voltage or current levels, and the sense circuit to sense a fourth instance of the sense level of the selected plurality of MBCs; and
a read logic circuit configured to determine the read state of the selected plurality of MBCs based on a presence or absence of a change between the first instance of the sense level and the second instance of the sense level and a presence or absence of a change between the third instance of the sense level and the fourth instance of the sense level.

4. The memory device of claim 3, wherein the sense circuit comprises:
a plurality of current or voltage sources to apply a fixed current or fixed voltage to the selected plurality of MBCs;
a plurality of first switches and first capacitors coupled together and configured to store the first instance of the sense level of the selected plurality of MBCs;
a plurality of second switches and second capacitors coupled together and configured to store the second instance of the sense level and the third instance of the sense level of the selected plurality of MBCs; and
a plurality of first comparators coupled to the plurality of first switches and first capacitors and the plurality of second switches and second capacitors and configured to compare the second instance of the sense level to the first instance of the sense level.

5. The memory device of claim 1, wherein the MBCs includes a first Magnetic Tunnel Junction (MTJ) element, a second MTJ element and a third MTJ element.

6. The memory device of claim 5, wherein the one or more memory circuits include:
a word line circuit, a bit line circuit and a source line circuit configured to bias the selected plurality of MBCs with a first set of sense voltage or current levels, and a sense circuit to sense a first instance of a sense level of the selected plurality of MBCs;
the word line circuit, the bit line circuit and the source line circuit configured to bias the selected plurality of MBCs with a first set of program voltage or current levels;
the word line circuit, the bit line circuit and the source line circuit configured to bias the selected plurality of MBCs with the first set of sense voltage or current levels, and the sense circuit to sense a second instance of the sense level of the selected plurality of MBCs;
the word line circuit, the bit line circuit and the source line circuit configured to bias the selected plurality of MBCs with a second set of sense voltage or current levels, and the sense circuit to sense a third instance of the sense level of the selected plurality of MBCs;
the word line circuit, the bit line circuit and the source line circuit configured to bias the selected plurality of MBCs with a second set of program voltage or current levels;
the word line circuit, the bit line circuit and the source line circuit configured to bias the selected plurality of MBCs with the second set of sense voltage or current levels, and the sense circuit to sense a fourth instance of the sense level of the selected plurality of MBCs;
the word line circuit, the bit line circuit and the source line circuit configured to bias the selected plurality of MBCs with a third set of sense voltage or current levels, and the sense circuit to sense a fifth instance of the sense level of the selected plurality of MBCs;
the word line circuit, the bit line circuit and the source line circuit configured to bias the selected plurality of MBCs with a third set of program voltage or current levels;
the word line circuit, the bit line circuit and the source line circuit configured to bias the selected plurality of MBCs with the third set of sense voltage or current levels, and the sense circuit to sense a sixth instance of the sense level of the selected plurality of MBCs; and
a read logic circuit configured to determine the read state of the selected plurality of MBCs based on a presence or absence of a change between the first instance of the sense level and the second instance of the sense level, a presence or absence of a change between the third instance of the sense level and the fourth instance of the sense level and a presence or absence of a change between the fifth instance of the sense level and the sixth instance of the sense level.

7. The memory device of claim 6, wherein the sense circuit comprises:
a plurality of current or voltage sources to apply a fixed current or voltage to the selected plurality of MBCs;

a plurality of first switches and first capacitors coupled together and configured to store the first instance of the sense level, the third instance of the sense level and the fifth instance of the sense level of the selected plurality of MBCs;

a plurality of second switches and second capacitors coupled together and configured to store the second instance of the sense level, the fourth instance of the sense level and the sixth instance of the sense level of the selected plurality of MBCs;

a plurality of comparators coupled to the plurality of first switches and first capacitors and the plurality of second switches and second capacitors and configured to compare the second instance of the sense level to the first instance of the sense level, to compare the fourth instance of the sense level to the third instance of the sense level and to compare the sixth instance of the sense level to the fifth instance of the sense level.

8. A memory device comprising:

an array of Multi-Bit Cells (MBCs), the MBCs including a number (N) of cell elements coupled in series and having two different states, such that the MBCs have $2^N$ states;

one or more memory circuits configured to;
  receive a read command for a selected plurality of MBCs;
  sense the selected plurality of the MBCs 2N times to determine N+1 instances of a state parameter value;
  program the selected plurality of MBCs, between sensing of the selected plurality of MBCs, using successive ones of N sets of programming parameters;
  compare successive ones of the N+1 instances of the state parameter value to determine N state change results for the selected plurality of MBCs;
  determine a read state for the selected plurality of MBCs based on the N state change results; and
  output the read state of the selected plurality of MBCs in response to the received read command.

9. The memory device of claim 8, wherein the selected plurality of MBCs includes a computing device readable media word.

10. The memory device of claim 8, wherein the selected plurality of MBCs includes a computing device readable media page.

11. The memory device of claim 8, wherein the selected plurality of MBCs includes a computing device readable media code word.

12. The memory device of claim 8, wherein the one or more circuits are further configured to:

write the determined read state back to the selected plurality of MBCs.

13. The memory device of claim 8, wherein:

a first one of the N sets of programming parameters is selected to switch a first one of the plurality of cell elements between a first one and a second one of two states; and a second one of the N sets of programming parameters is selected to switch a second one of the plurality of cell elements between the first one and the second one of two states.

14. The memory device of claim 8, wherein:

the plurality of cell elements comprise a plurality of Magnetic Tunnel Junction (MTJ) elements; and the $2^N$ different states comprise $2^N$ different resistive states.

15. A method of reading a Multi-Bit Cell (MBC) including a plurality of cell elements coupled in series and having $2^N$ different states comprising:

sensing the MBC 2N times to determine N+1 instances of a state parameter value;

programming the MBC, between the sensing of the MBC, using successive ones of N sets of programming parameters;

comparing successive ones of the N+1 instances of the state parameter value to determine N bit state change results; and determining a read state of the MBC based on the determined N bit state change results.

16. The method according to claim 15, further comprising:

writing the determined read state back to the selected MBC.

17. The method according to claim 15, wherein:

a first one of the N sets of programming parameters is selected to switch a first one of the plurality of cell elements between a first one and a second one of two bit states; and a second one of the N sets of programming parameters is selected to switch a second one of the plurality of cell elements between the first one and the second one of two bit states.

18. The method according to claim 15, wherein:

the plurality of cell elements comprise a plurality of Magnetic Tunnel Junction (MTJ) elements; and the $2^N$ different bit states comprise $2^N$ different resistive states.

* * * * *